(12) United States Patent
Lin et al.

(10) Patent No.: US 10,170,341 B1
(45) Date of Patent: Jan. 1, 2019

(54) RELEASE FILM AS ISOLATION FILM IN PACKAGE

(71) Applicant: Taiwan Semiconductor Manufacturing Company, Ltd., Hsinchu (TW)

(72) Inventors: Jing-Cheng Lin, Hsinchu (TW); Li-Hui Cheng, New Taipei (TW); Po-Hao Tsai, Zhongli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/800,964

(22) Filed: Nov. 1, 2017

Related U.S. Application Data

(60) Provisional application No. 62/527,240, filed on Jun. 30, 2017.

(51) Int. Cl.
*H01L 21/00* (2006.01)
*H01L 23/02* (2006.01)
*H01L 21/56* (2006.01)
*H01L 23/538* (2006.01)
*H01L 23/367* (2006.01)
*H01L 23/31* (2006.01)
(Continued)

(52) U.S. Cl.
CPC ......... *H01L 21/566* (2013.01); *H01L 21/486* (2013.01); *H01L 21/4853* (2013.01); *H01L 21/4857* (2013.01); *H01L 21/4871* (2013.01); *H01L 21/568* (2013.01); *H01L 23/3114* (2013.01); *H01L 23/3675* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 25/117* (2013.01); *H01L 25/50* (2013.01); *H01L 2224/214* (2013.01); *H01L 2225/1035* (2013.01); *H01L 2225/1058* (2013.01); *H01L 2225/1094* (2013.01)

(58) Field of Classification Search
CPC ............... H01L 21/566; H01L 21/4853; H01L 23/5386; H01L 24/20; H01L 21/76877; H01L 21/568; H01L 21/4857; H01L 21/486; H01L 21/4871; H01L 24/19; H01L 23/5383; H01L 23/5384; H01L 23/3675; H01L 23/3114; H01L 25/117
See application file for complete search history.

(56) References Cited

U.S. PATENT DOCUMENTS 8,361,842 B2   1/2013  Yu et al.
8,680,647 B2   3/2014  Yu et al.
(Continued)

FOREIGN PATENT DOCUMENTS

CN   201327770 A   7/2013
CN   201543642 A   11/2015
CN   201631719 A   9/2016

*Primary Examiner* — Alonzo Chambliss
(74) *Attorney, Agent, or Firm* — Slater Matsil, LLP

(57) ABSTRACT

A method includes forming a release film over a carrier, attaching a device over the release film through a die-attach film, encapsulating the device in an encapsulating material, performing a planarization on the encapsulating material to expose the device, detaching the device and the encapsulating material from the carrier, etching the die-attach film to expose a back surface of the device, and applying a thermal conductive material on the back surface of the device.

20 Claims, 29 Drawing Sheets

(51) Int. Cl.
*H01L 25/11* (2006.01)
*H01L 21/48* (2006.01)
*H01L 25/00* (2006.01)
*H01L 23/00* (2006.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,866,309 | B2 | 10/2014 | Chang et al. |
| 8,877,554 | B2 | 11/2014 | Tsai et al. |
| 10,008,485 | B2 | 6/2018 | Lin et al. |
| 2003/0035269 | A1* | 2/2003 | Chiu .......... H01L 23/367 361/704 |
| 2003/0117770 | A1* | 6/2003 | Montgomery ...... B82Y 10/00 361/679.46 |
| 2005/0255304 | A1* | 11/2005 | Brink ............... B82Y 10/00 428/209 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0131858 | A1 | 5/2014 | Pan et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0380334 | A1* | 12/2015 | Hu ................... H01L 23/36 257/712 |

* cited by examiner

RELEASE FILM AS ISOLATION FILM IN PACKAGE

PRIORITY CLAIM AND CROSS-REFERENCE

This application claims the benefit of the following provisionally filed U.S. Patent application: Application Ser. No. 62/527,240, filed Jun. 30, 2017, and entitled "Release Film as Isolation Film in Package," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20A illustrate the cross-sectional views of intermediate stages in the formation of a package in accordance with some embodiments.

DETAILED DESCRIPTION

Figure 1:
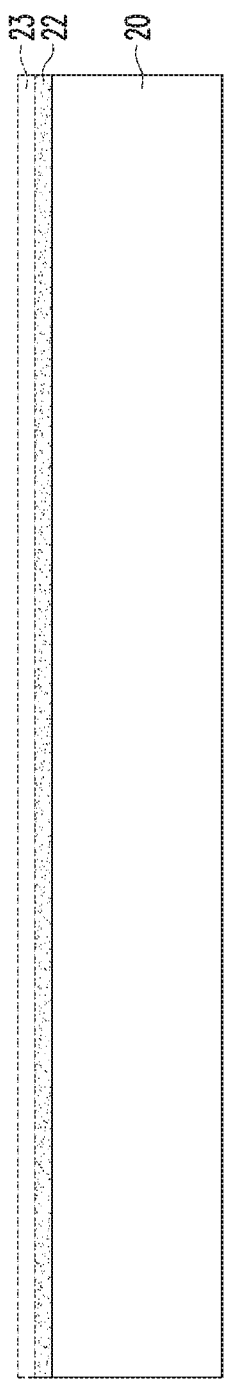

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the Info package are illustrated in accordance with some embodiments. Some variations of some embodiments are discussed. Throughout the various views and illustrative embodiments, like reference numbers are used to designate like elements.

Figure 22:
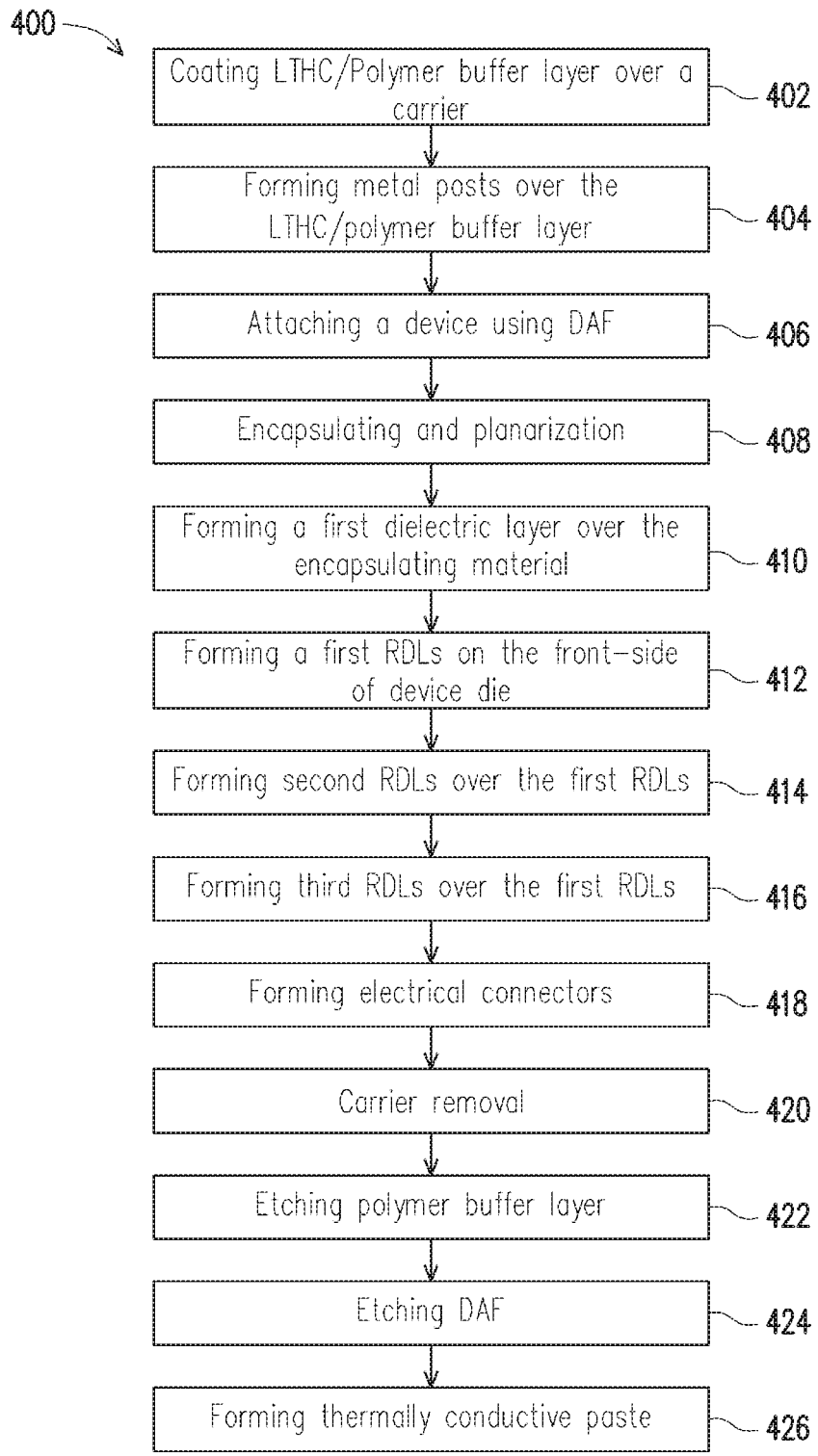
FIG. 22 illustrates a process flow for forming a package in accordance with some embodiments.

FIGS. 1 through 20A illustrate the cross-sectional views of intermediate stages in the formation of a package in accordance with some embodiments. The steps shown in FIG. 1 through 20A are also illustrated schematically in the process flow 400 shown in FIG. 22.

Referring to FIG. 1, carrier 20 is provided, and release film 22 is coated on carrier 20. The respective step is illustrated as step 402 in the process flow shown in FIG. 22. Carrier 20 is formed of a transparent material, and may be a glass carrier, a ceramic carrier, an organic carrier, or the like. Carrier 20 may have a round top-view shape, and may have a size of a silicon wafer. For example, carrier 20 may have an 8-inch diameter, a 12-inch diameter, or the like. Release film 22 is in physical contact with the top surface of carrier 20. Release film 22 may be formed of a Light To Heat Conversion (LTHC) coating material. Release film 22 may be applied onto carrier 20 through coating. In accordance with some embodiments of the present disclosure, the LTHC coating material is capable of being decomposed under the heat of light/radiation (such as laser), and hence can release carrier 20 from the structure formed thereon. In accordance with some embodiments of the present disclosure, LTHC coating material 22 includes carbon black (carbon particles), a solvent, a silicon filler, and/or an epoxy. The epoxy may include polyimide or another polymer such as Acrylic. The polyimide, if included in the LTHC coating material, is different from the typical polyimide that is used for photolithography since it may no longer be light-sensitive, and may not be removed through photo exposure and development. The thickness of LTHC coating material 22 may be in the range between about 1 μm and about 2 μm in accordance with some exemplary embodiments of the present disclosure. It is appreciated that the values recited through the description of the present disclosure are examples, and may be changed to different values. LTHC coating material 22 may be coated in a flowable form, and is then cured, for example, under ultra-violet (UV) light. LTHC coating material 22 is a homogenous material, and the entire LTHC coating material 22 has the same composition.

In accordance with some embodiments, as shown in FIG. 1, polymer buffer layer 23 is formed on LTHC coating material 22. In accordance with some embodiments, polymer buffer layer 23 is formed of polybenzoxazole (PBO), polyimide, benzocyclobutene (BCB), or another applicable polymer. In accordance with alternative embodiments, polymer buffer layer 23 is not formed. Accordingly, polymer buffer layer 23 is illustrated using dashed lines to indicate it may or may not be formed.

Figure 2:
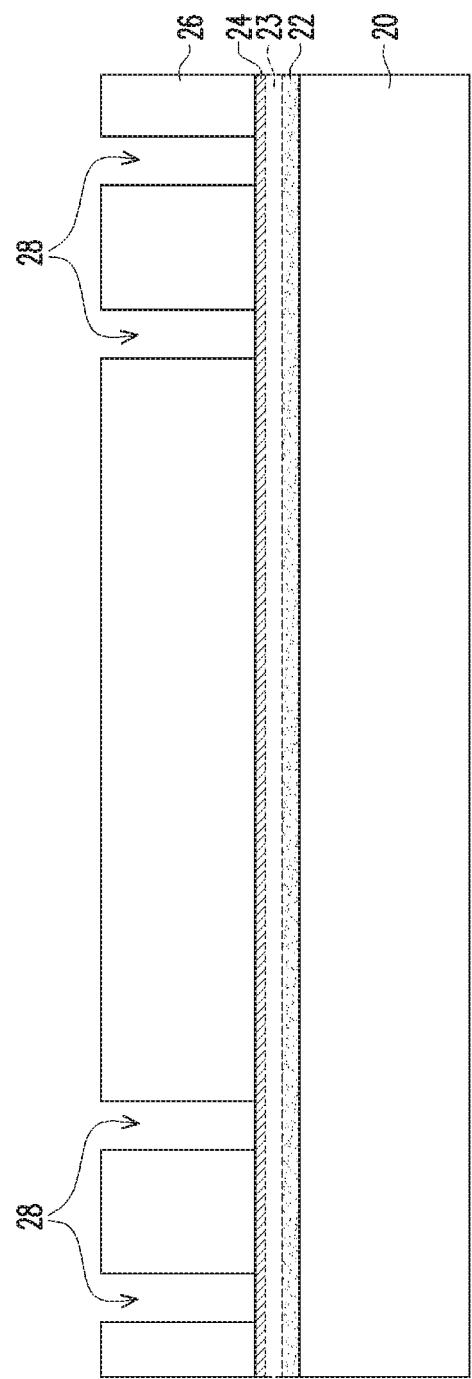
Figure 3:
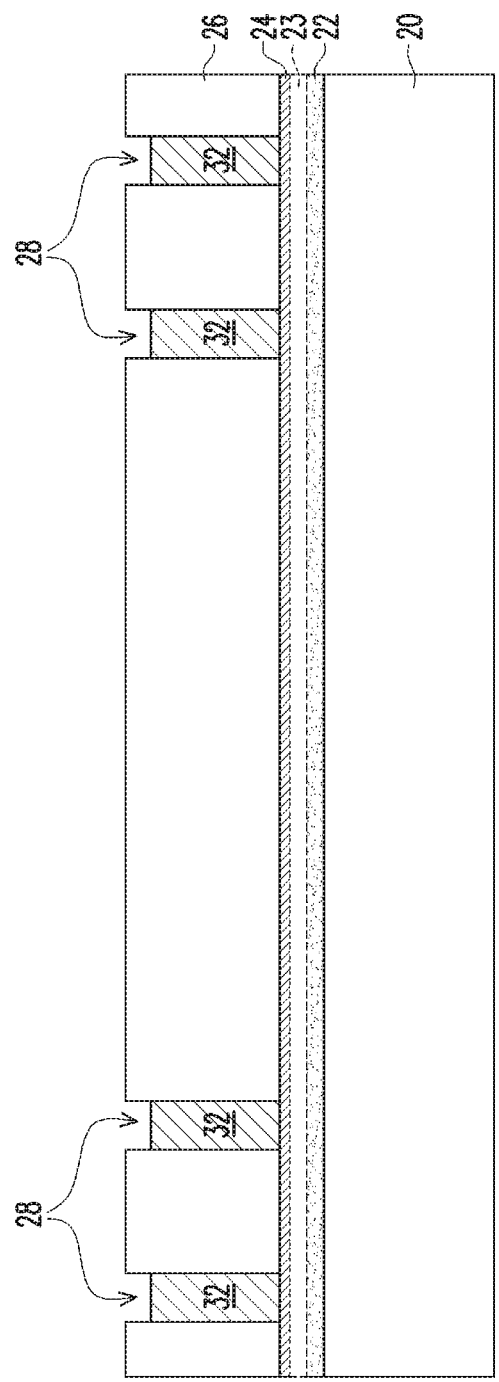
Figure 4:
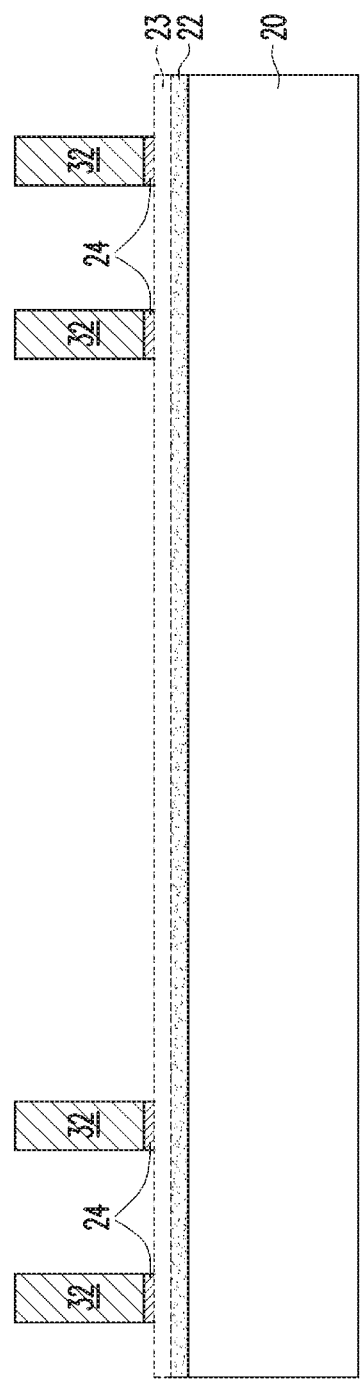

FIGS. 2 through 4 illustrate the formation of metal posts 32. The respective step is illustrated as step 404 in the process flow shown in FIG. 22. Throughout the description, metal posts 32 are alternatively referred to as through-vias 32 since metal posts 32 penetrate through the subsequently dispensed encapsulating material.

Referring to FIG. 2, metal seed layer 24 is formed, for example, through Physical Vapor Deposition (PVD). In accordance with some embodiments of the present disclosure, polymer buffer layer 23 is not formed, and hence metal seed layer 24 is in physical contact with LTHC coating material 22. In accordance with other embodiments of the present disclosure, polymer buffer layer 23 is formed, and metal seed layer 24 is over and in contact with polymer buffer layer 23. In accordance with some embodiments of the present disclosure, metal seed layer 24 includes a titanium layer and a copper layer over the titanium layer. In accordance with alternative embodiments of the present disclosure, metal seed layer 24 includes a copper layer in contact with LTHC coating 22 or polymer buffer layer 23.

As also shown in FIG. 2, photo resist 26 is formed over metal seed layer 24. A light-exposure is then performed on photo resist 26 using a photo lithography mask (not shown). After a subsequent development, openings 28 are formed in photo resist 26. Some portions of metal seed layer 24 are exposed through openings 28.

Next, as shown in FIG. 3, metal posts 32 are formed by plating a metallic material in openings 28. Metal posts 32 are alternatively referred to as through-vias or through-molding vias since they will penetrate through the subsequently formed encapsulating material (which may be a molding compound) in the final package. The plated metallic material may be copper or a copper alloy. The top surfaces of metal posts 32 are lower than the top surface of photo resist 26, so that the shapes of metal posts 32 are confined by openings 28. Metal posts 32 may have substantially vertical and straight edges. Alternatively, metal posts 32 may have a sand timer shape in a cross-sectional view, with the middle parts of metal posts 32 being narrower than the respective top parts and bottom parts.

In subsequent steps, photo resist 26 is removed, and hence the underlying portions of metal seed layer 24 are exposed. The exposed portions of metal seed layer 24 are then removed in an etching step, for example, in an anisotropic etching step or an isotropic etching step. The edges of the remaining seed layer 24 may thus be co-terminus or substantially co-terminus with the respective overlying portions of metal posts 32. The resulting metal posts 32 are illustrated in FIG. 4. Throughout the description, the remaining portions of metal seed layer 24 are considered as parts of metal posts 32. The top-view shapes of metal posts 32 include, and are not limited to, circular shapes, rectangles, hexagons, octagons, and the like. After the formation of metal posts 32, polymer buffer layer 23 or LTHC coating material 22 is exposed.

Figure 5:
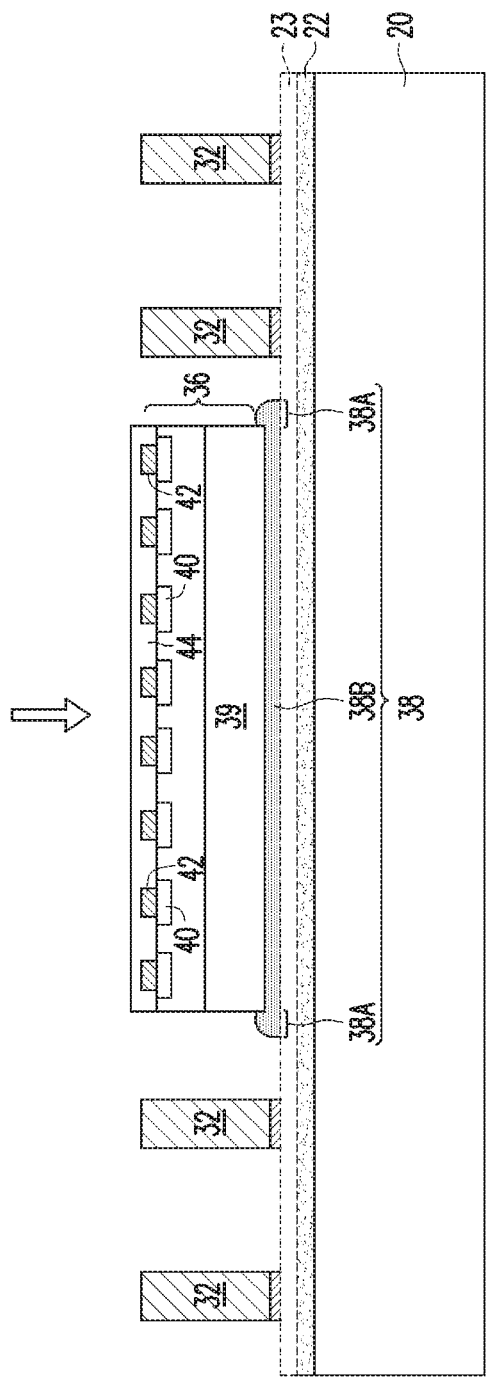

FIG. 5 illustrates the placement/attachment of device 36. Device 36 may be a device die, and hence is referred to as device die 36 hereinafter, while device 36 may also be a package. The respective step is illustrated as step 406 in the process flow shown in FIG. 22. Device die 36 is attached to polymer buffer layer 23 or LTHC coating material 22 through Die-Attach Film (DAF) 38, which is an adhesive film pre-attached on device die 36 before device die 36 is placed on LTHC coating 22. Device die 36 may include a semiconductor substrate 39 having a back surface (the surface facing down) in physical contact with DAF 38. Device die 36 may include integrated circuit devices (such as active devices, which include transistors, for example, not shown) at the front surface (the surface facing up) of the semiconductor substrate 39. In accordance with some embodiments of the present disclosure, device die 36 is a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is at wafer level, although one device die 36 is illustrated, a plurality of identical device dies 36 is placed over LTHC coating 22 in the die placement step, and the device dies may be allocated as an array including a plurality of rows and a plurality of columns.

In accordance with some exemplary embodiments, metal pillars 42 (such as copper pillars) are pre-formed as parts of device die 36, and metal pillars 42 are electrically coupled to the integrated circuit devices such as transistors (not shown) in device die 36. In accordance with some embodiments of the present disclosure, a dielectric material such as a polymer fills the gaps between neighboring metal pillars 42 to form top dielectric layer 44. Top dielectric layer 44 may also include a portion covering and protecting metal pillars 42. Polymer layer 44 may be formed of PBO or polyimide in accordance with some embodiments of the present disclosure.

In the placement of device die 36, a force is applied to push device die 36 against carrier 20, and the force is represented by an arrow. Since DAF 38 is soft, the original DAF 38 that is co-terminus with device die 36 is squeezed, and some portions 38A of DAF 38 are pushed out of the region directly underlying device die 36. Also, portions 38A may have some portions higher than the top surface of portion 38B of DAF 38. Portions 38A may be in contact with the sidewalls of device die 36, and the contacting part of device die 36 may be the semiconductor substrate 39 (such as a silicon substrate).

Figure 6:
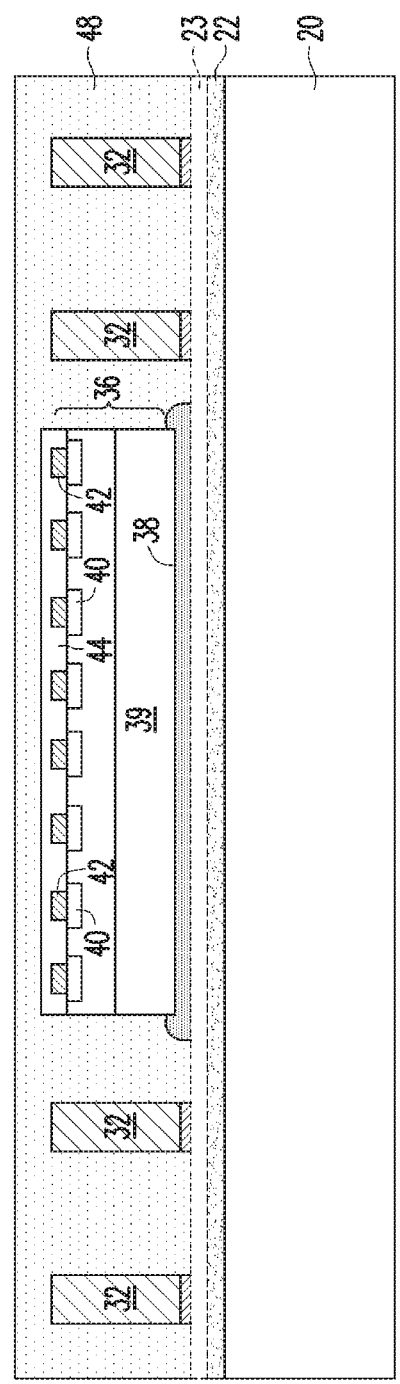

Next, device die 36 and metal posts 32 are encapsulated in encapsulating material 48, as shown in FIG. 6. The respective step is illustrated as step 408 in the process flow shown in FIG. 22. Encapsulating material 48 fills the gaps between neighboring through-vias 32 and the gaps between through-vias 32 and device die 36. Encapsulating material 48 may include a molding compound, a molding underfill, an epoxy, and/or a resin. The top surface of encapsulating material 48 is higher than the top ends of metal pillars 42.

The molding compound may include a base material, which may be a polymer, a resin, an epoxy, or the like, and filler particles (not shown) in the base material. The filler particles may be dielectric particles of $SiO_2$, $Al_2O_3$, silica, or the like, and may have spherical shapes. Also, the spherical filler particles may have the same or different diameters.

Figure 7:
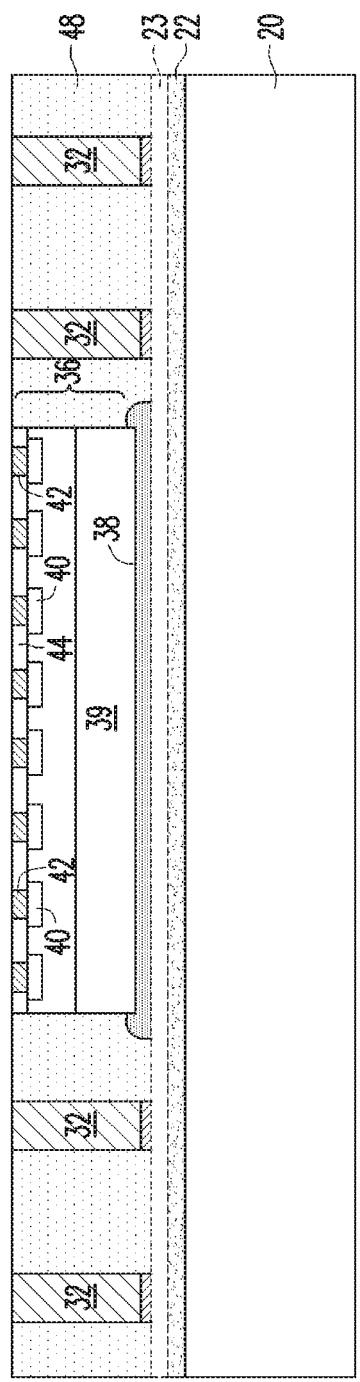

In a subsequent step, as shown in FIG. 7, a planarization step such as a Chemical Mechanical Polish (CMP) step or a mechanical grinding step is performed to thin encapsulating material 48 and dielectric layer 44, until through-vias 32 and metal pillars 42 are all exposed. The respective step is also illustrated as step 408 in the process flow shown in FIG. 22. Due to the planarization process, the top ends of through-vias 32 are substantially level (coplanar) with the top surfaces of metal pillars 42, and are substantially coplanar with the top surface of encapsulating material 48.

Figure 8:
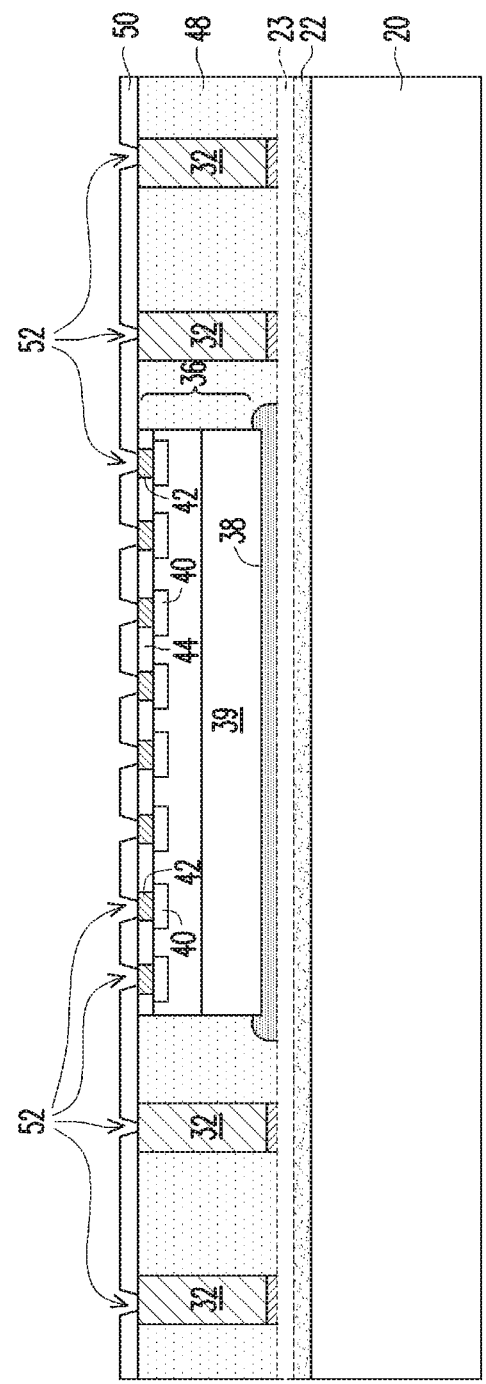
Figure 9:
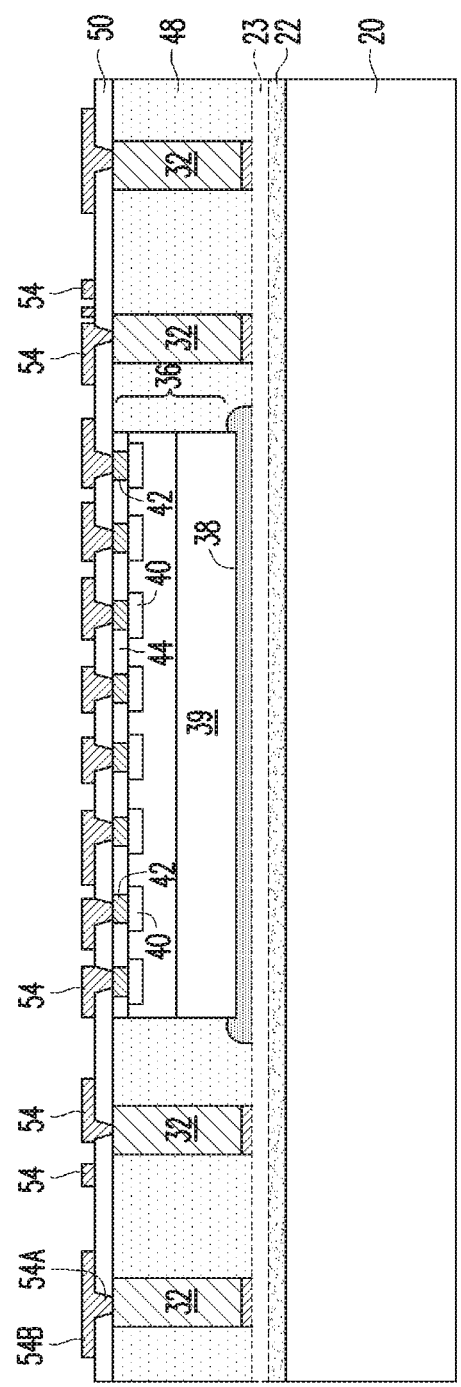

FIGS. 8 through 12 illustrate the formation of a front-side redistribution structure. FIGS. 8 and 9 illustrate the formation of a first layer of Redistribution Lines (RDLs) and the respective dielectric layer. Referring to FIG. 8, dielectric layer 50 is formed. The respective step is illustrated as step 410 in the process flow shown in FIG. 22. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings 52 are then formed, for example, through a photo lithography process. In accordance with some embodiments in which dielectric layer 50 is formed of a photo sensitive material such as PBO or polyimide, the formation of openings 52 involves a photo exposure of dielectric layer 50 using a lithography mask (not shown), and developing dielectric layer 50. Through-vias 32 and metal pillars 42 are exposed through openings 52.

Figure 21:
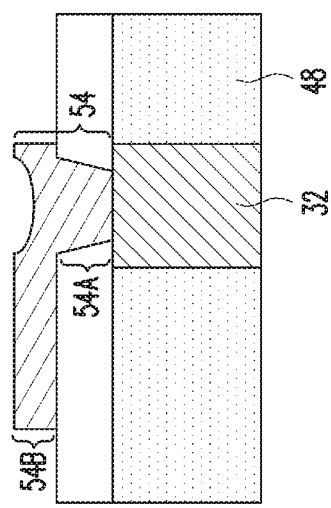
FIG. 21 illustrates an amplified view of a portion of a redistribution line in accordance with some embodiments.

Next, referring to FIG. 9, RDLs 54 are formed over dielectric layer 50. The respective step is illustrated as step 412 in the process flow shown in FIG. 22. RDLs 54 include vias 54A formed in dielectric layer 50 to connect to metal pillars 42 and through-vias 32, and metal traces (metal lines) 54B over dielectric layer 50. In accordance with some embodiments of the present disclosure, RDLs 54 (including 54A and 54B) are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist. FIG. 21 illustrates an amplified view of one of RDLs 54 and dielectric layer 50. As shown in FIG. 21, the top surfaces of the portions of RDLs 54 directly over via 54A may be recessed lower than the portion of RDLs 54 directly overlying dielectric layer 50. Other RDLs 54 and RDLs 58 and 64 (FIG. 12) may have a similar profile.

Figure 10:
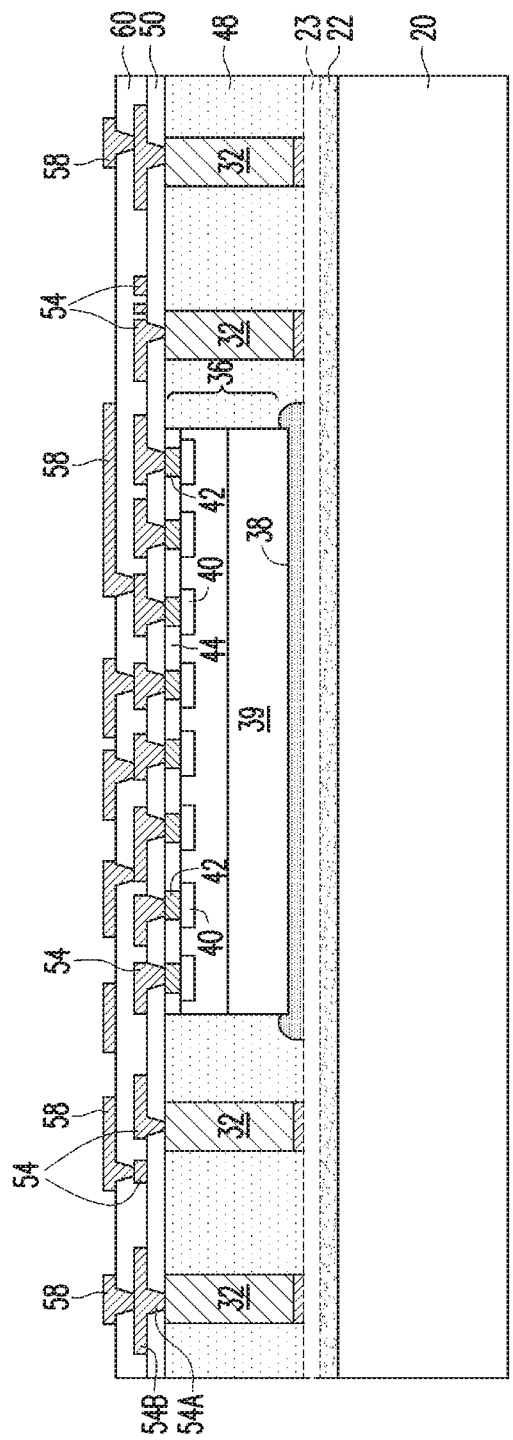

Referring to FIG. 10, in accordance with some embodiments of the present disclosure, dielectric layer 60 is formed over the structure shown in FIG. 9, followed by the formation of openings in dielectric layer 60. Some portions of RDLs 54 are thus exposed through the openings. Dielectric layer 60 may be formed using a material selected from the same candidate materials for forming dielectric layer 50, which may include PBO, polyimide, BCB, or other organic or inorganic materials. RDLs 58 are then formed. The respective step is illustrated as step 414 in the process flow shown in FIG. 22. RDLs 58 also include via portions extending into the openings in dielectric layer 60 to contact RDLs 54, and metal line portions directly over dielectric layer 60. The formation of RDLs 58 may be the same as the formation of RDLs 54, which includes forming a seed layer, forming a patterned mask, plating RDLs 58, and then removing the patterned mask and undesirable portions of the seed layer.

Figure 11:
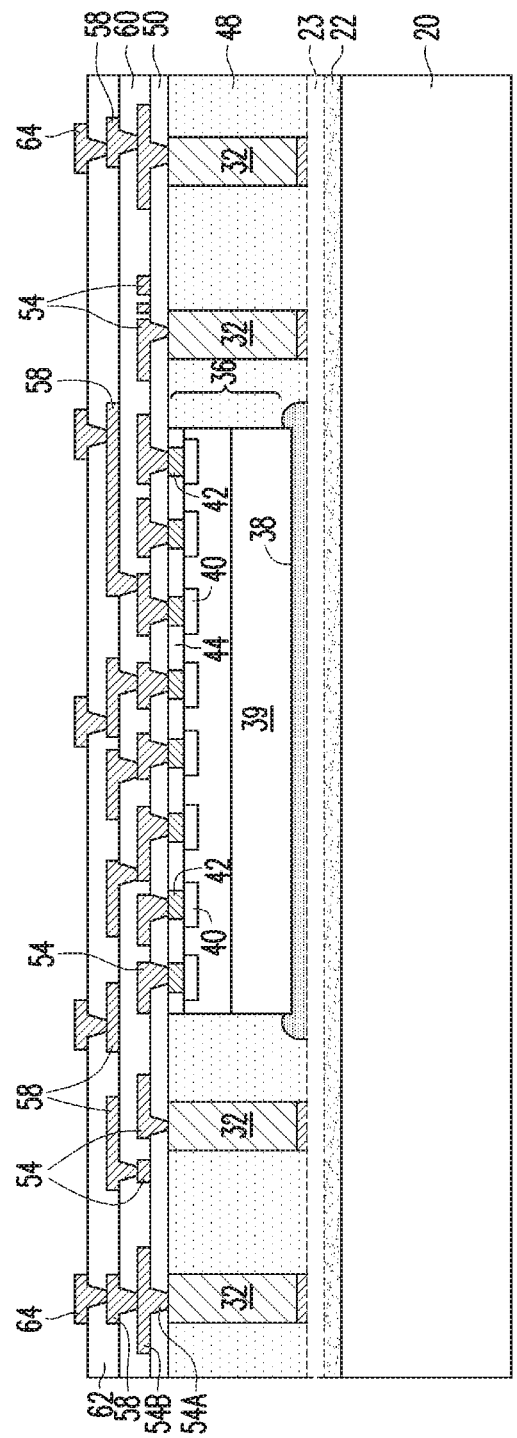

FIG. 11 illustrates the formation of dielectric layer 62 and RDLs 64 over dielectric layer 60 and RDLs 58. The respective step is illustrated as step 416 in the process flow shown in FIG. 22. Dielectric layer 62 may be formed of a material selected from the same group of candidate materials for forming dielectric layers 50 and 60. RDLs 64 may also be formed of a metal or a metal alloy including aluminum, copper, tungsten, or alloys thereof. It is appreciated that although in the illustrated exemplary embodiments, three layers of RDLs (54, 58 and 64) are formed, the package may have any number of RDL layers such as one layer, two layers, or more than three layers.

Figure 12:
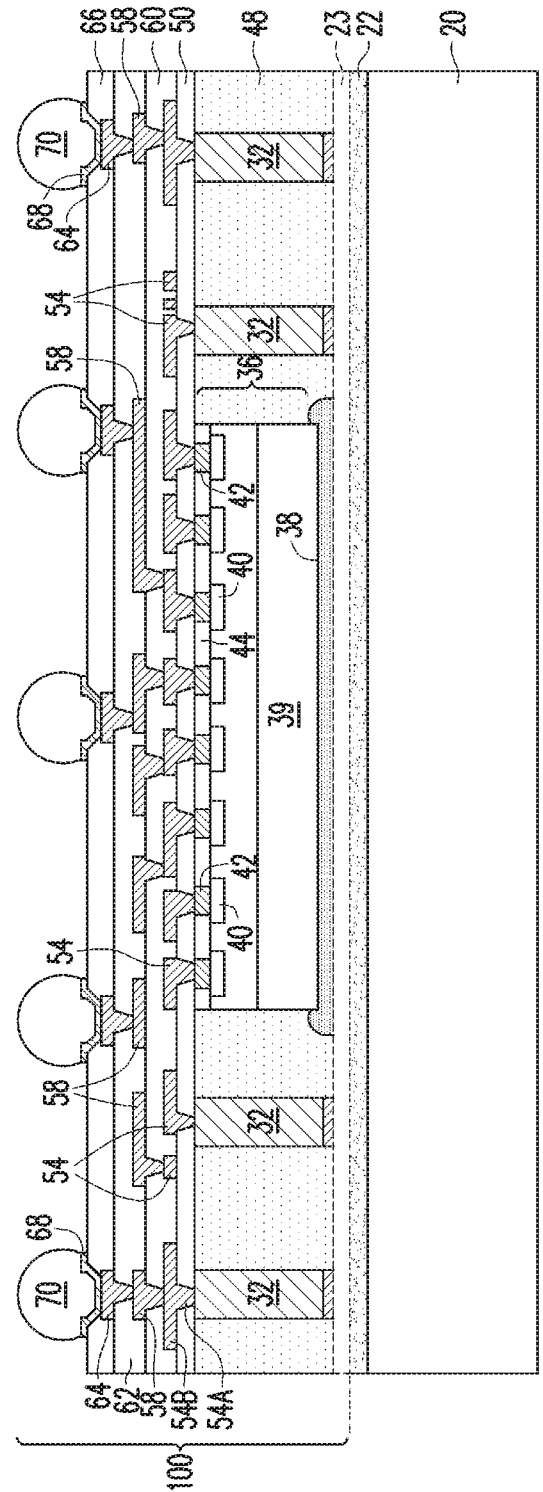

FIG. 12 illustrates the formation of dielectric layer 66, Under-Bump Metallurgies (UBMs) 68, and electrical connectors 70 in accordance with some exemplary embodiments. Dielectric layer 66 may be formed of a material selected from the same group of candidate materials for forming dielectric layers 50, 60, 62, and 66. For example, dielectric layer 66 may be formed using PBO, polyimide, or BCB. Openings are formed in dielectric layer 66 to expose the underlying metal pads, which are parts of RDLs 64 in the illustrative exemplary embodiments. In accordance with some embodiment of the present disclosure, UBMs 68 are formed to extend into the openings in dielectric layer 66 to contact the metal pads in RDLs 64. UBMs 68 may be formed of nickel, copper, titanium, or multi-layers thereof. In accordance with some exemplary embodiments, UBMs 68 include a titanium layer and a copper layer over the titanium layer.

Electrical connectors 70 are then formed. The respective step is illustrated as step 418 in the process flow shown in FIG. 22. The formation of electrical connectors 70 may include placing solder balls on the exposed portions of UBMs 68, and then reflowing the solder balls, and hence electrical connectors 70 are solder regions. In accordance with alternative embodiments of the present disclosure, the formation of electrical connectors 70 includes performing a plating step to form solder layers over UBMs 68, and then reflowing the solder layers. Electrical connectors 70 may also include non-solder metal pillars, or metal pillars and solder caps over the non-solder metal pillars, which may also be formed through plating. Throughout the description, the structure including release film 22 and the overlying structure in combination is referred to as package 100, which is a composite wafer (and also referred to as composite wafer 100 hereinafter) including a plurality of device dies 36.

Figure 13:
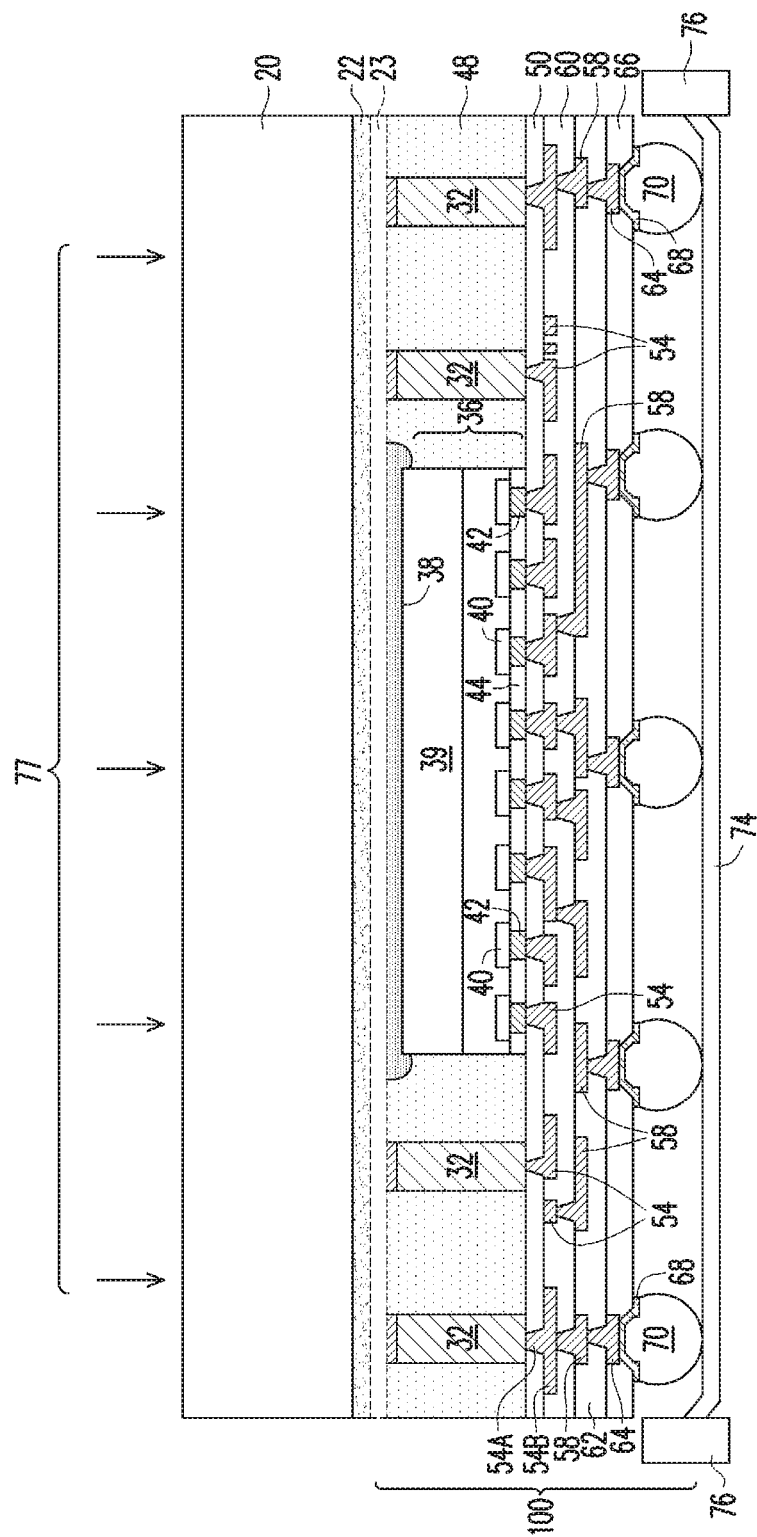

Next, referring to FIG. 13, composite wafer 100 is placed on tape 74, which is attached to frame 76. In accordance with some embodiments of the present disclosure, electrical connectors 70 are in contact with tape 74. Next, light 77 (represented by arrows) is projected on LTHC coating material 22, and light 77 penetrates through the transparent carrier 20. In accordance with some exemplary embodiments of the present disclosure, light 77 is a laser beam, which scans through the entire LTHC coating material 22.

As a result of the light-exposure (such as the laser scanning), carrier 20 may be lifted off from LTHC coating material 22, and hence composite wafer 100 is de-bonded (demounted) from carrier 20. The respective step is illustrated as step 420 in the process flow shown in FIG. 22. During the light exposure, at least a top portion of LTHC coating material 22 is decomposed in response to the heat introduced by the light exposure, allowing carrier 20 to be separated from the underlying structure. The residue of LTHC coating material 22 is then removed, for example, through a plasma cleaning step. The resulting composite wafer 100 is shown in FIG. 14.

Figure 14:
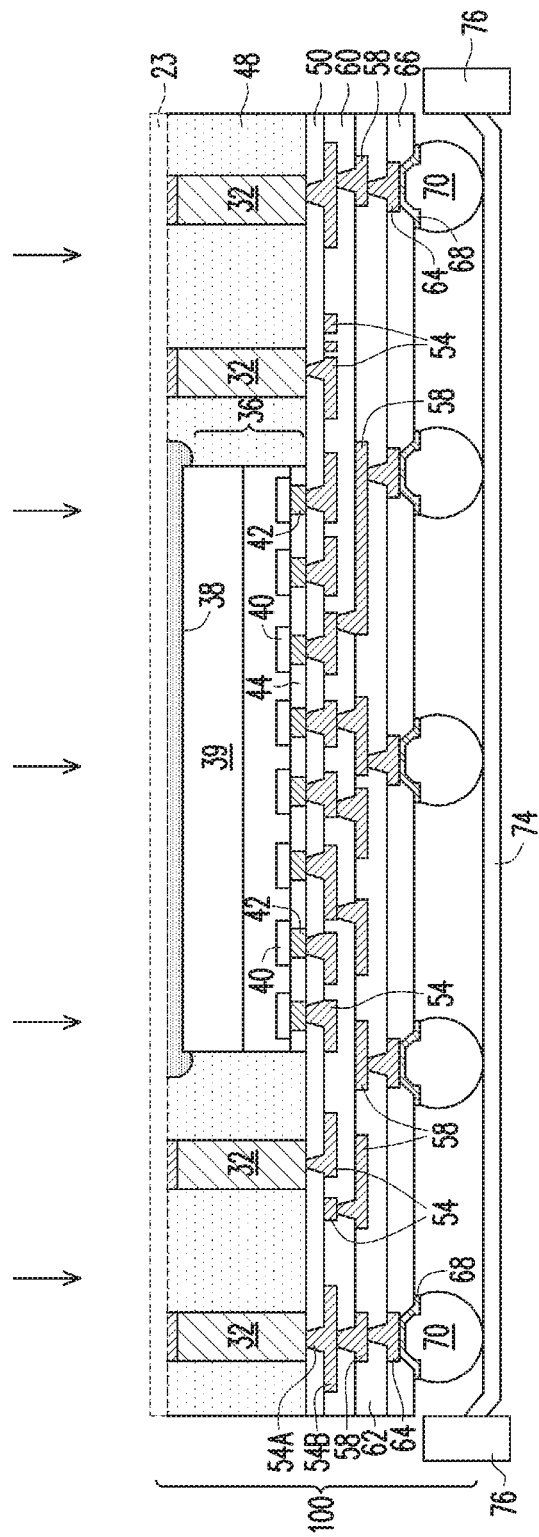
Figure 15:
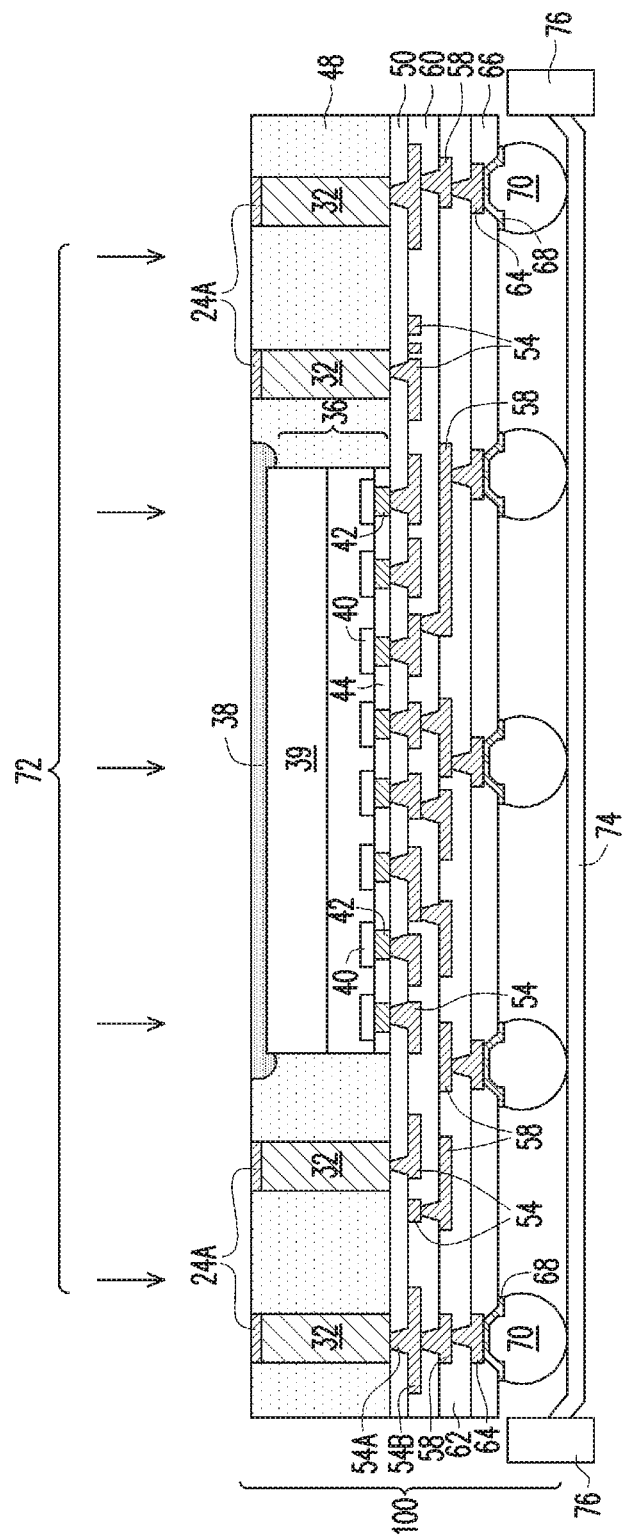

In accordance with some embodiments of the present disclosure in which polymer buffer layer 23 is formed, as shown in FIG. 14, polymer buffer layer 23 is exposed at the top of composite wafer 100. In accordance with alternative embodiments of the present disclosure in which polymer buffer layer 23 is not formed, through-vias 32, encapsulating material 48, and DAF 38 are exposed, and the corresponding structure is shown in FIG. 15. Polymer layer 23, if formed, is etched, also resulting in the structure as shown in FIG. 15. The respective step is illustrated as step 422 in the process flow shown in FIG. 22.

In accordance with some embodiments of the present disclosure, titanium layers 24A (FIG. 15), which are portions of metal seed layer 24 as shown in FIG. 3, are etched. Since titanium has higher electrical resistivity than copper, by removing the titanium layers, the copper portions of through-vias 32, which have a lower resistivity than titanium layers, are exposed. Hence, the connection to through-vias 32 may be established with a lower resistance. In accordance with some embodiments of the present disclosure, the etching of titanium layers is performed through wet etching using a hydrogen fluoride (HF) solution, a phosphoric acid, or a mixture of HF and phosphoric acid. The etching may also be performed using dry etching.

Figure 16A:
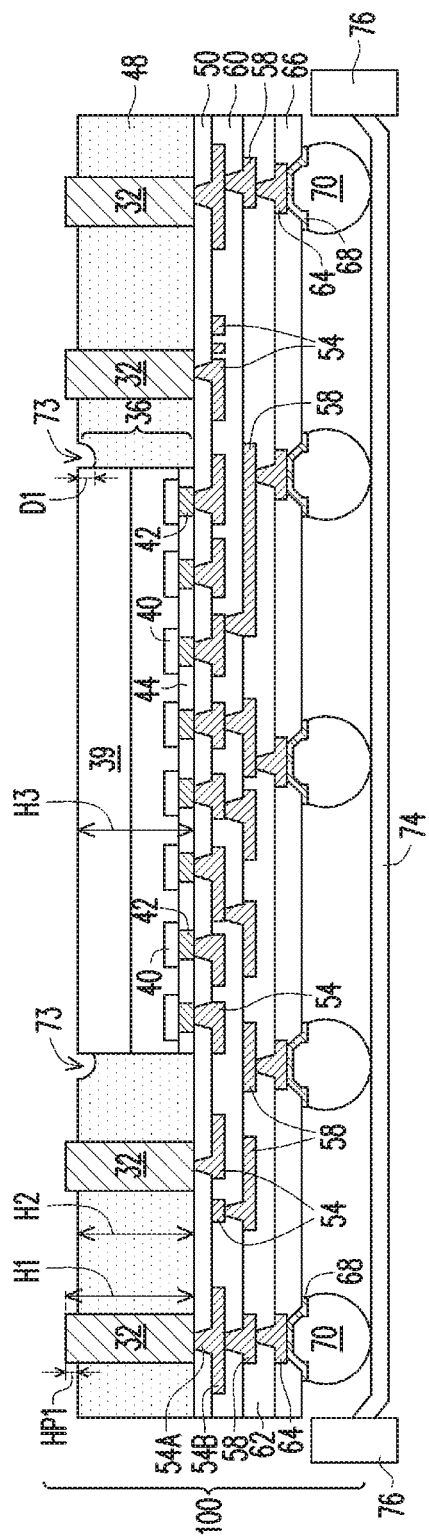
Figure 16B:
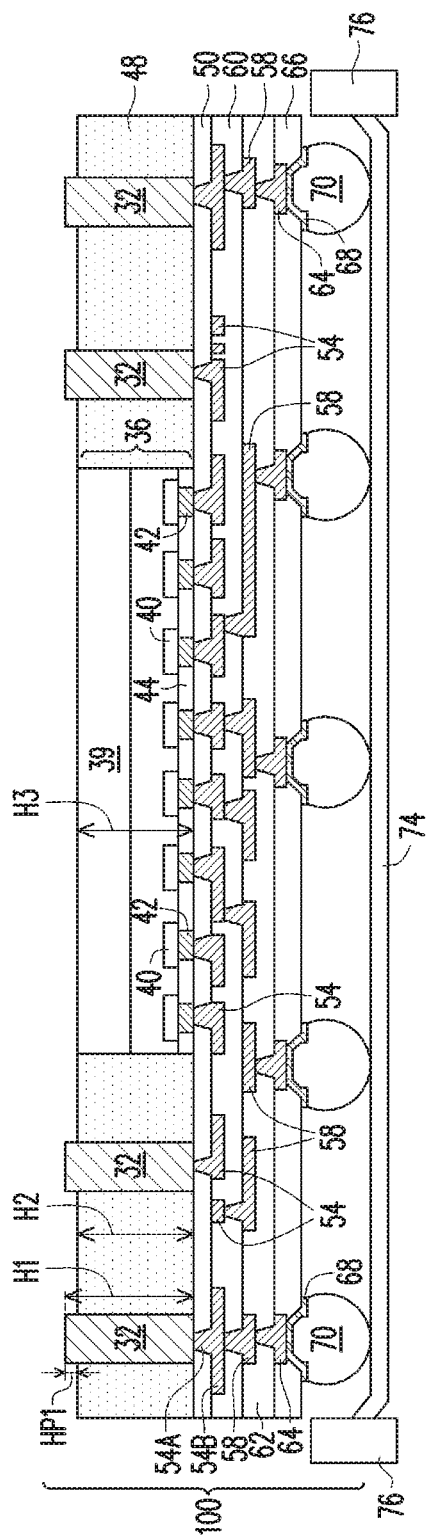
Figure 16C:
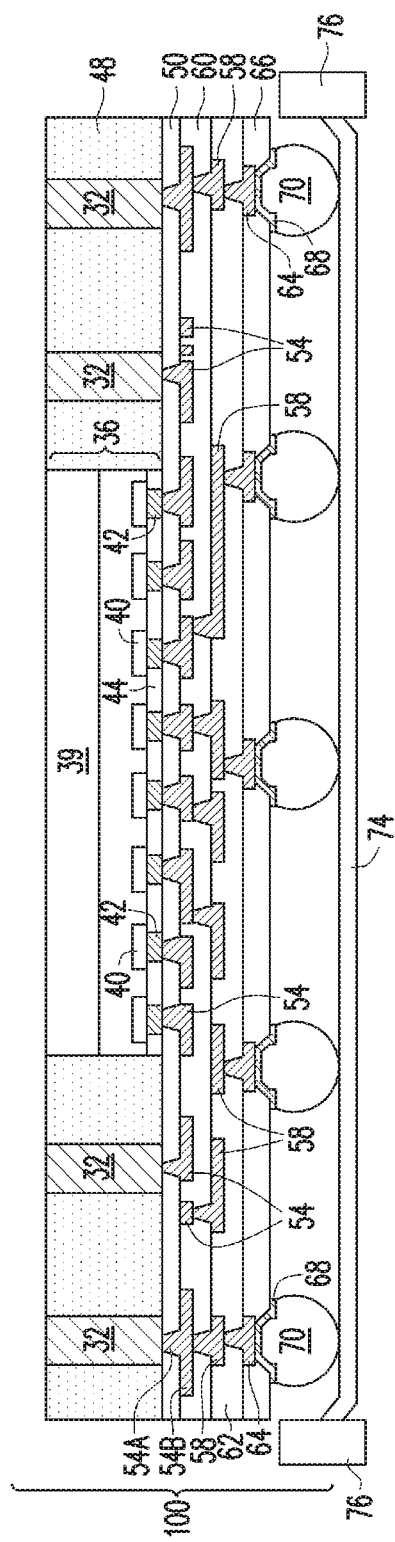

Also, DAF 38 is etched in an etching step. The respective step is illustrated as step 424 in the process flow shown in FIG. 22. In accordance with some embodiments of the present disclosure, the etching is performed through dry etching. The etching gas may include oxygen ($O_2$), $CF_4$, and possibly some other gases such as nitrogen ($N_2$). The etching is represented by arrows 72 as shown in FIG. 15. The resulting structure is shown in FIG. 16A through FIG. 16C. In accordance with some exemplary embodiments, in the etching, the oxygen in the etching gas may have a flow rate in the range between about 50 sccm and about 1,500 sccm, the $CF_4$ in the etching gas may have a flow rate in the range between about 50 sccm and about 1,500 sccm, and the nitrogen in the etching gas may have a flow rate in the range between about 50 sccm and about 2,000 sccm.

The etching gas may result in the etching of both DAF 38 and encapsulating material 48. DAF 38 may also be fully removed (as shown in FIGS. 16A through 16C) or partially removed (as shown in FIG. 20C). The etching selectivity, which is the ratio of the etching rate of DAF 38 to the etching rate of encapsulating material 48, may be adjusted by adjusting etching conditions such as the flow rates of oxygen and $CF_4$, so that various effects may be resulted. For example, the etching rate of DAF 38 may be higher than, equal to, or lower than the etching rate of encapsulating material 48. Due to the etching of encapsulating material 48, the top surface of encapsulating material 48 is recessed to be lower than the top surfaces of through-vias 32. On the other hand, the etching gas does not attack through-vias 32, and hence through-vias 32 protrude above encapsulating material 48. In accordance with some embodiments of the present disclosure, the protruding height HP1 (FIG. 16A) is in the range between about 2 μm and about 50 μm.

In accordance with alternative embodiments, the removal of DAF 38 is achieved through laser scanning, and hence DAF 38 and the top surface portion of encapsulating material 48 are removed. Due to the high thermal conductivity of through-vias 32 and substrate 39 of device die 36, through-vias 32 and substrate 39 of device die 36, although also subject to the laser scanning, are not recessed.

In FIG. 16A, the height of through-vias 32 is represented as H1, the height of encapsulating material 48 is represented as H2, and the height of device die 36 is represented as H3. Height H1 is greater than heights H2 and H3 due to the protruding of through-vias 32. Depending on how much encapsulating material 48 is recessed, height H3 of device die 36 may be greater than, equal to, or smaller than, height H2 of encapsulating material 48. Due to the existence of portions 38A (FIG. 15), recesses 73 are formed, as shown in FIG. 16A. It is appreciated that recesses 73 are parts of a recess ring encircling device die 36 when viewed from the top of device die 36. Recesses 73 may extend lower than the top surface of device die 36. Furthermore, the sidewalls of device die 36 may be exposed to recesses 73. Depth D1 of recesses 73 may be in the range between about 1 μm and about 100 μm in accordance with some embodiments of the present disclosure.

FIG. 16B illustrates composite wafer 100 in accordance with some embodiments. These embodiments are similar to the embodiments as shown in FIG. 16A, except the recesses 73 as shown in FIG. 16A are not formed.

FIG. 16C illustrates composite wafer 100 in accordance with some embodiments. These embodiments are similar to the embodiments as shown in FIG. 16A, except through-vias 32 have top surfaces co-planar with the top surfaces of encapsulating material 48 and device die 36, and the recesses 73 as shown in FIG. 16A are not formed.

Figure 17:
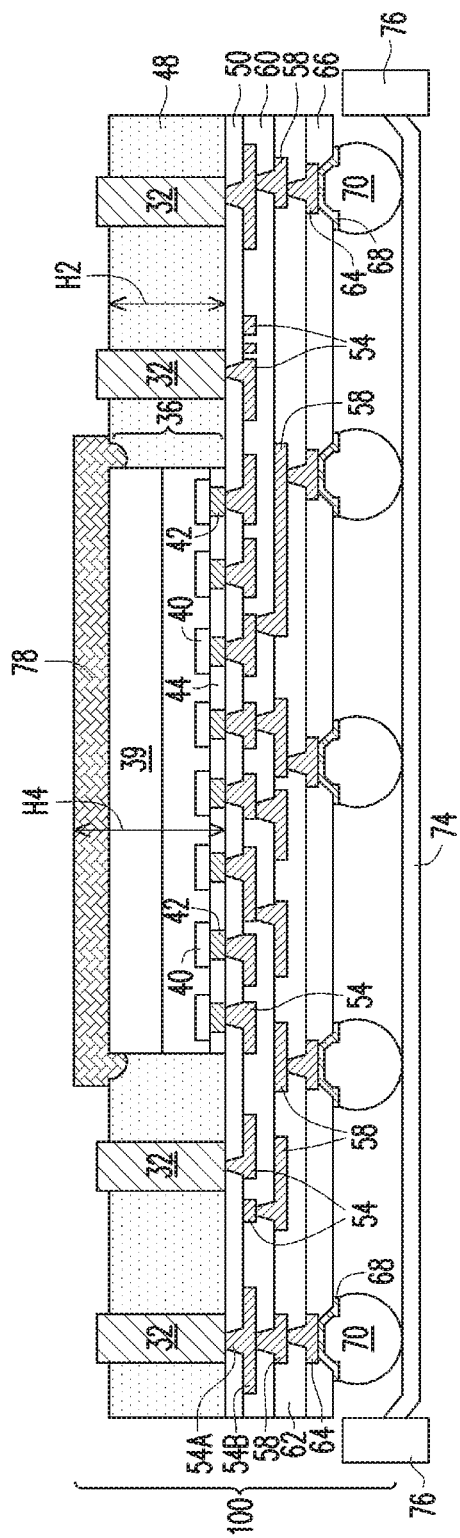

In accordance with some embodiments of the present disclosure, as shown in FIG. 17, thermal conductive paste 78 is applied to cover device die 36. The respective step is illustrated as step 426 in the process flow shown in FIG. 22. In accordance with alternative embodiments of the present disclosure, no conductive paste 78 is applied, as is shown in FIG. 20B. Thermal conductive paste 78 may include a polymer mixed with metal particles such as copper particles. Thermal conductive paste 78 may also be a solder paste. Accordingly, thermal conductive paste 78 may also be electrically conductive. Thermal conductive paste 78 may be applied through printing or another applicable method, and then cured into a solid state. Thermal conductive paste 78 may or may not be thermally treated (during which it is cured) to remove the polymer and/or solvent therein, leaving the metal particles and a small amount of adhesive in the solidified thermal conductive paste 78. The majority (such as more than 80 weight percent) of the thermal conductive paste 78 may be metal particles in accordance with some exemplary embodiments. The thermal treatment may include a treating temperature in the range between about 160° C. and about 200° C., and the thermal treatment may last between about 30 minutes and about 2 hours. Thermal conductive paste 78 may have a thermal conductivity higher than about 1 W/k*m, higher than about 5 W/k*m, higher than about 20 W/k*m, higher than about 50 W/k*m, or even higher.

Thermal conductive paste 78 may be have a top view area greater than the top view area of device die 36, and may fully cover or partially cover device die 36. Furthermore, recesses 73 (FIG. 16) may also be filled by thermal conductive paste 78. Accordingly, thermal conductive paste 78 in the recesses 73 may fully encircle device die 36, and the vertical interface between the portion of thermal conductive paste 78 in the recesses 73 and device die 36 may form a full ring. The top surface of thermal conductive paste 78 is level with or higher than the top surface of encapsulating material 48, which means the combined height H4 of device die 36 and thermal conductive paste 78 is equal to or greater than the thickness H2 of encapsulating material 48.

Figure 18:
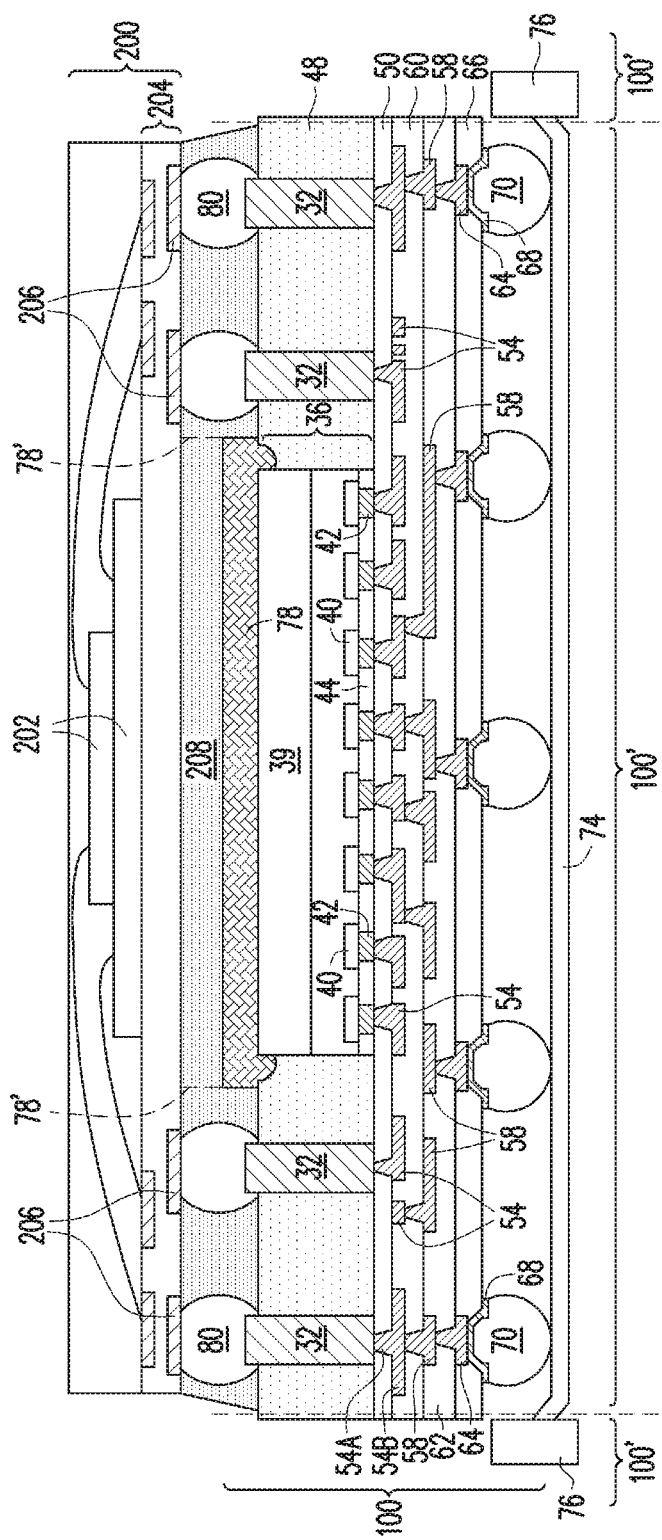

As shown in FIG. 18, composite wafer 100 includes a plurality of packages 100' (schematically illustrated), which are identical to each other, with each of packages 100' including through-vias 32 and one device die 36. FIG. 18 also illustrates the bonding of package 200 to package 100', thus forming a plurality of identical Package-on-Package (PoP) structure/packages. The bonding is performed through solder regions 80, which join through-vias 32 to metal pads 206 in the overlying package 200. Solder regions 80 may be in contact with the top surfaces and the sidewalls of the protruding portions of through-vias 32, and hence the contact resistance is reduced. In accordance with some embodiments of the present disclosure, package 200 includes package substrate 204 and device die(s) 202, which may be memory dies such as Static Random Access Memory (SRAM) dies, Dynamic Random Access Memory (DRAM) dies, or the like. Underfill 208 is also disposed into the gap between packages 200 and the underlying packages 100', and is cured.

In accordance with some embodiments of the present disclosure, the top surface of conductive paste 78 is lower than the top surface of package 200. Accordingly, conductive paste 78 is vertically spaced apart from package 200 by a portion of underfill 208. In accordance with alternative embodiments, as also shown in FIG. 18, conductive paste 78 is thick enough, and the top surface of conductive paste 78 contacts the bottom surface of package 200. Dashed lines 78' schematically shows the extended edges of conductive paste 78 that contacts package 200. In subsequently discussed packages shown in FIGS. 20A, 20C, 20D, and 20E, the edges 78' are also illustrated.

In accordance with alternative embodiments of the present disclosure, instead of bond package 200 to through-vias 32, a backside redistribution structure (not shown) is formed. The backside redistribution structure will include dielectric layers and RDLs in the dielectric layers, and package 200 is bonded over the backside RDLs in the backside redistribution structure. In order to form the backside redistribution structure, a carrier, instead of a tape, may be placed under composite wafer 100 as a support in the formation of the backside redistribution structure. Accordingly, electrical connectors 70 are adhered to the carrier through an adhesive film (not shown) during the formation of the backside redistribution structure.

Figure 19:
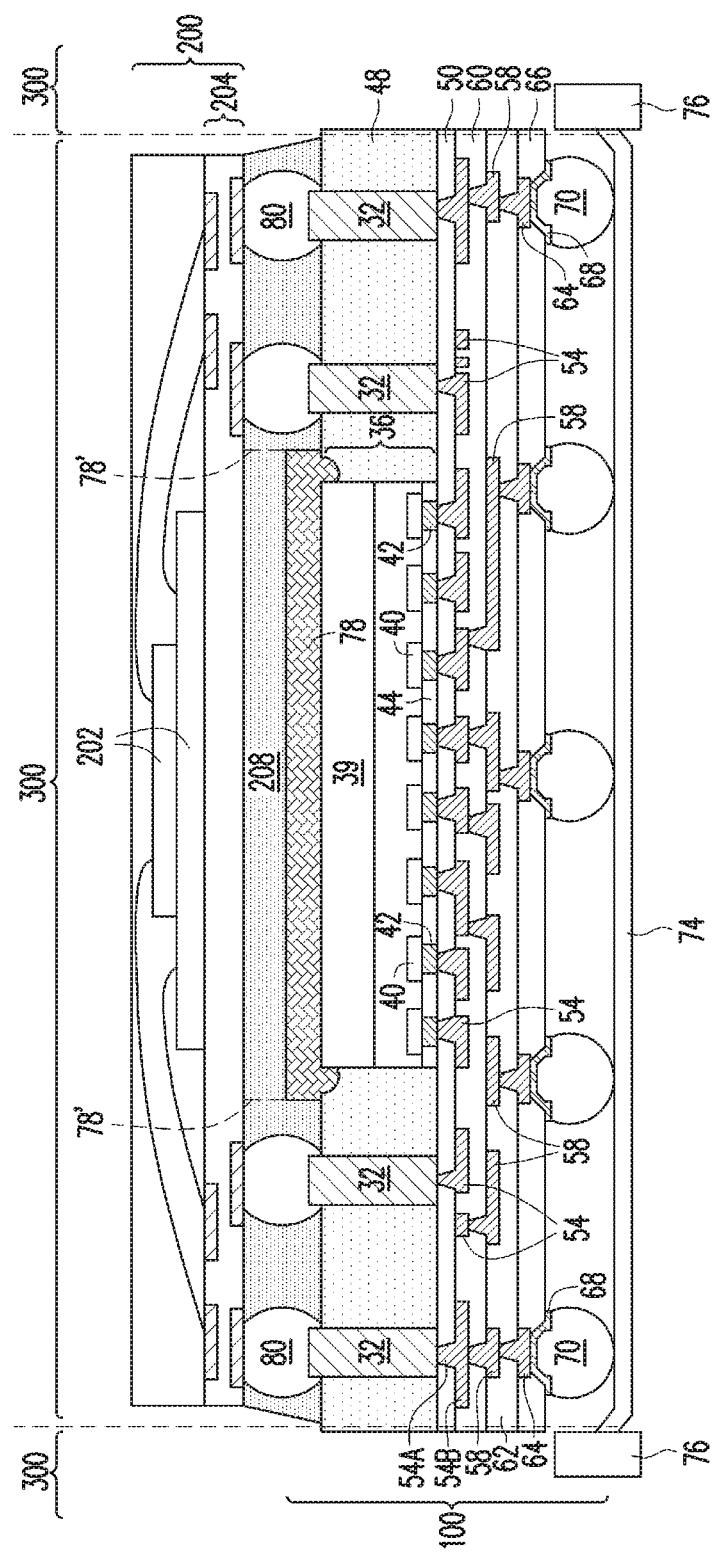

Next, referring to FIG. 19, a singulation (die-saw) process is performed to separate composite wafer 100 and the overlying packages 200 into individual packages 300, which are identical to each other. The resulting structure is shown in FIG. 19. The singulation may be performed on tape 74. The singulation may be performed using a blade, or may be performing using a laser to do pre-grooving, so that grooves are formed, and then using a blade to cut through the grooves.

Figure 20A:
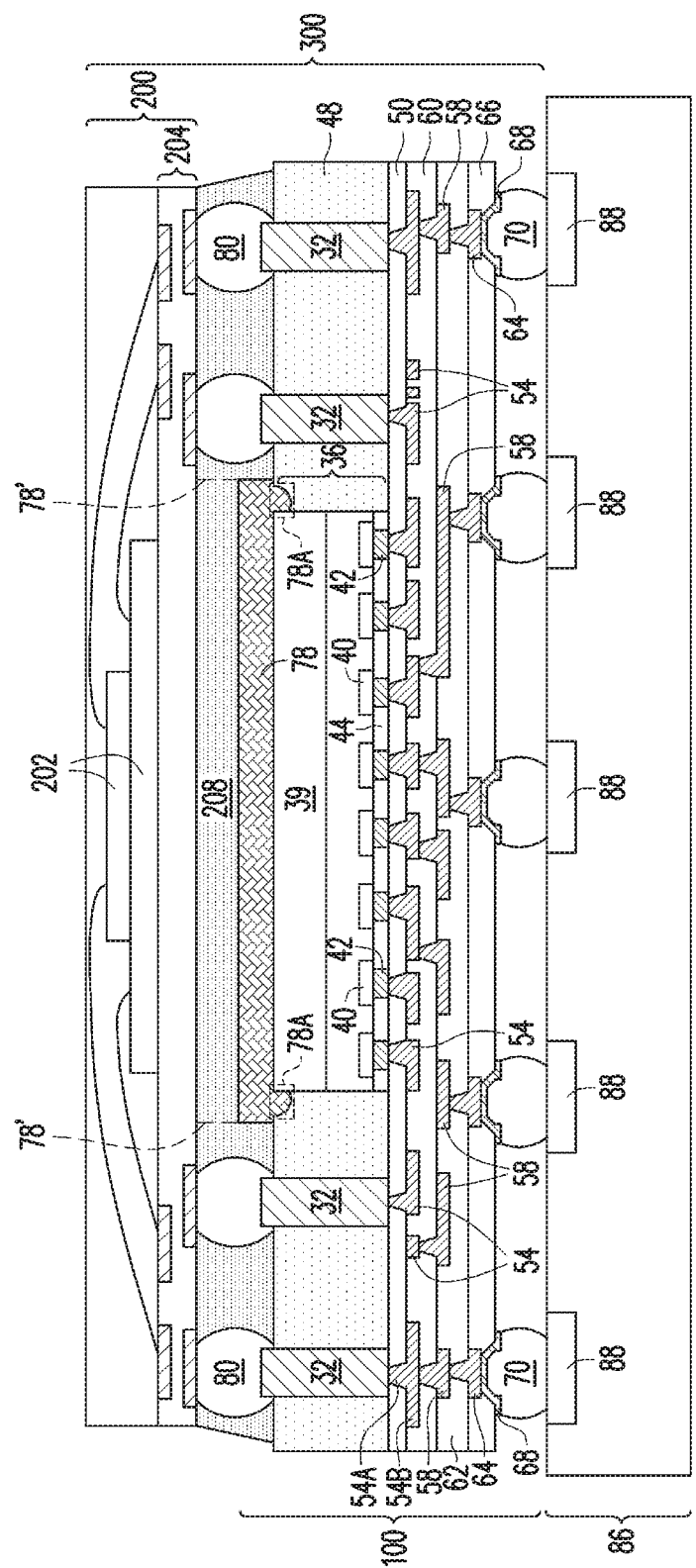
Figure 20B:
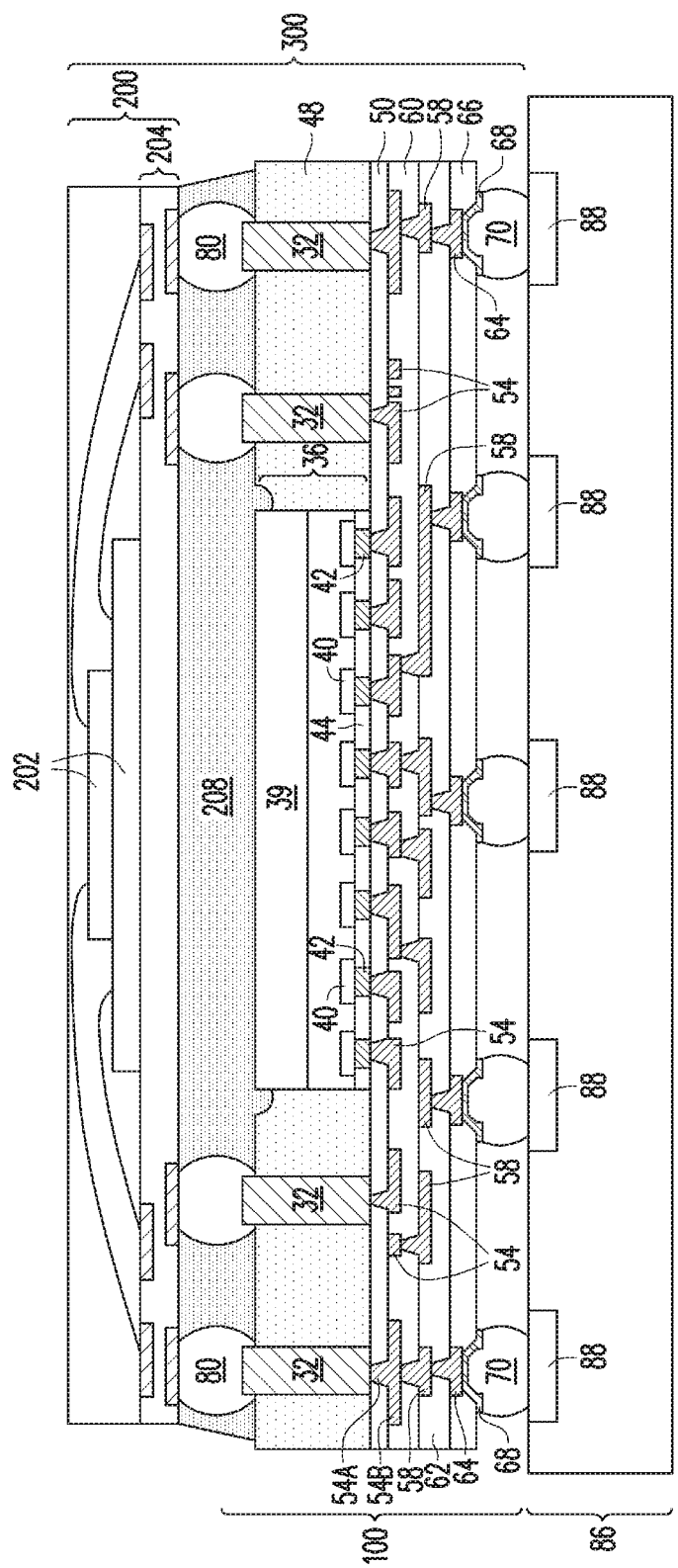
FIGS. 20B through 20F illustrate cross-sectional views of some packages in accordance with some embodiments.
Figure 20C:
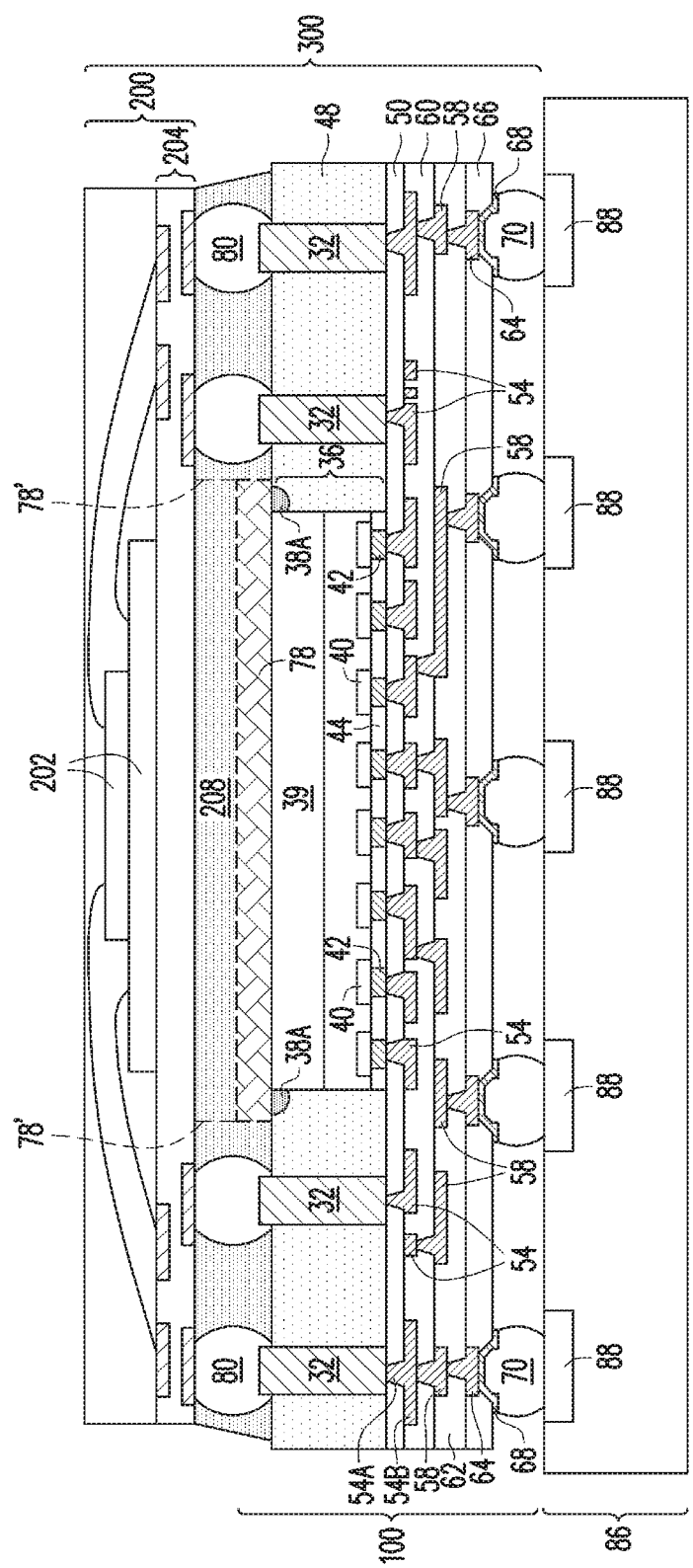

FIG. 20A illustrates the bonding of the singulated package 300 to package component 86 through solder regions 70. In accordance with some embodiments of the present disclosure, package component 86 is a package substrate, which may be a coreless substrate or a substrate having a core. In accordance with other embodiments of the present disclosure, package component 86 is a printed circuit board or a package. Solder regions 70 may be bonded to bond pads 88 in package component 86.

In package 300, thermal conductive paste 78 has a good thermal conductivity, and hence is efficient in conducting the heat generated in device die 36 into underfill 208. Underfill 208 may also be selected to have a relatively high thermal conductivity (although lower than the thermal conductivity of thermal conductive paste 78), and hence the heat may be conducted horizontally out of package 300. Thermal conductive paste 78 may also encircle and contact the sidewalls of device die 36, hence further improves the thermal conduction.

As shown in FIGS. 16A and 16B, the recesses 73 in FIGS. 16A and 16B may or may not be formed. Accordingly, in FIG. 20A, the portions 78A of conductive paste 78 may or may not exist, and the corresponding regions may be occupied by encapsulating regions 48 or portions of conductive paste 78.

FIG. 20B illustrates the cross-sectional view of package 300 in accordance with some embodiments of the present disclosure. Package 300 in accordance with these embodiments are similar to the package 300 shown in FIG. 20A, except no thermal conductive paste is formed directly over device die 36. Accordingly, the top surface of device die 36 is in physical contact with underfill 208. Since the polymer buffer layer 23 and DAF 38 (FIG. 14), which have low thermal conductivity values, have been removed and will not act as the barrier for heat dissipation, the thermal conductivity between device die 36 and underfill 208 is improved compared to the packages including polymer buffer layer 23 and DAF 38.

FIG. 20C illustrates the cross-sectional view of package 300 in accordance with some embodiments of the present disclosure. Package 300 in accordance with these embodiments are similar to the package 300 shown in FIG. 20A, except at least a bottom portion of DAF 38 remains, and recess may be or may not be formed. In accordance with some embodiments of the present disclosure, the formation of this structure is achieved by controlling the etching rate of DAF 38 to be close to the etching rate of encapsulating material 48, and stopping the etching process once device die 36 is exposed. In accordance with some embodiments, thermal conductive paste 78 is formed over device die 36. In accordance with alternatively embodiments, thermal conductive paste 78 is not formed over device die 36. Accordingly, thermal conductive paste 78 is shown with dashed lines to indicate it may or may not be formed.

Figure 20D:
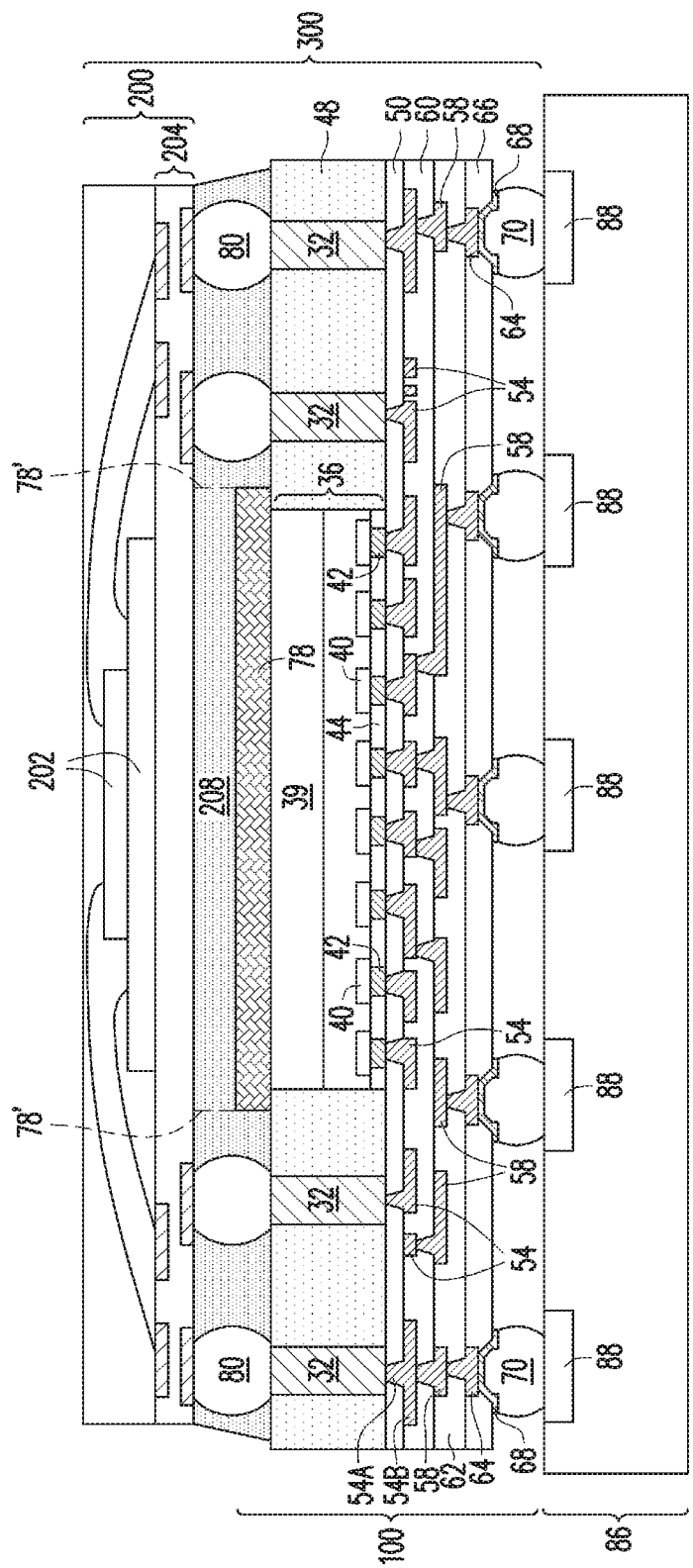

FIG. 20D illustrates the cross-sectional view of package 300 in accordance with some embodiments of the present disclosure. Package 300 in accordance with these embodiments are similar to the package 300 shown in FIG. 20A, except through-vias 32 do not protrude higher than the top surfaces of encapsulating material 48 and device die 36. Accordingly, the top surfaces of through-vias 32, encapsulating material 48, and device die 36 are coplanar with each other. The recesses 73 (FIG. 16A) may or may not be formed in accordance with these embodiments. The recesses 73, when formed, will be occupied by conductive paste 78.

Figure 20E:
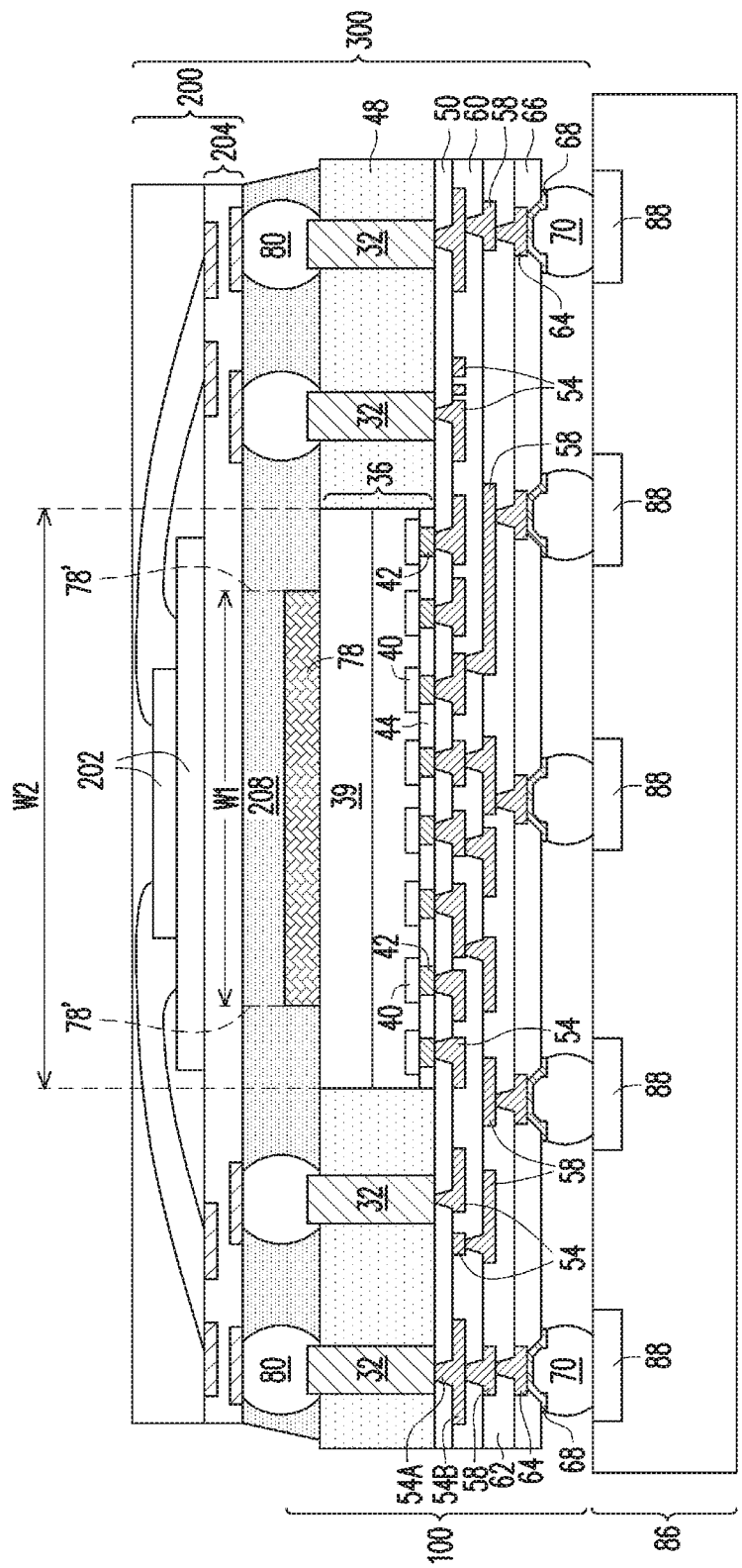

FIG. 20E illustrates the cross-sectional view of package 300 in accordance with some embodiments of the present disclosure. Package 300 in accordance with these embodiments are similar to the package 300 shown in FIG. 20A, except conductive paste 78 is smaller than device die 36. Accordingly, the top surface of device die 36 has a portion (for example, the center portion) in contact with conductive paste 78, and a portion in contact with underfill 208. Width W1 of conductive paste 78 is smaller than width W2 of device die 36. The recesses 73 (as shown in FIG. 16A) may or may not be formed in accordance with these embodiments. The recesses 73, when formed, will be occupied by underfill 208.

Figure 20F:
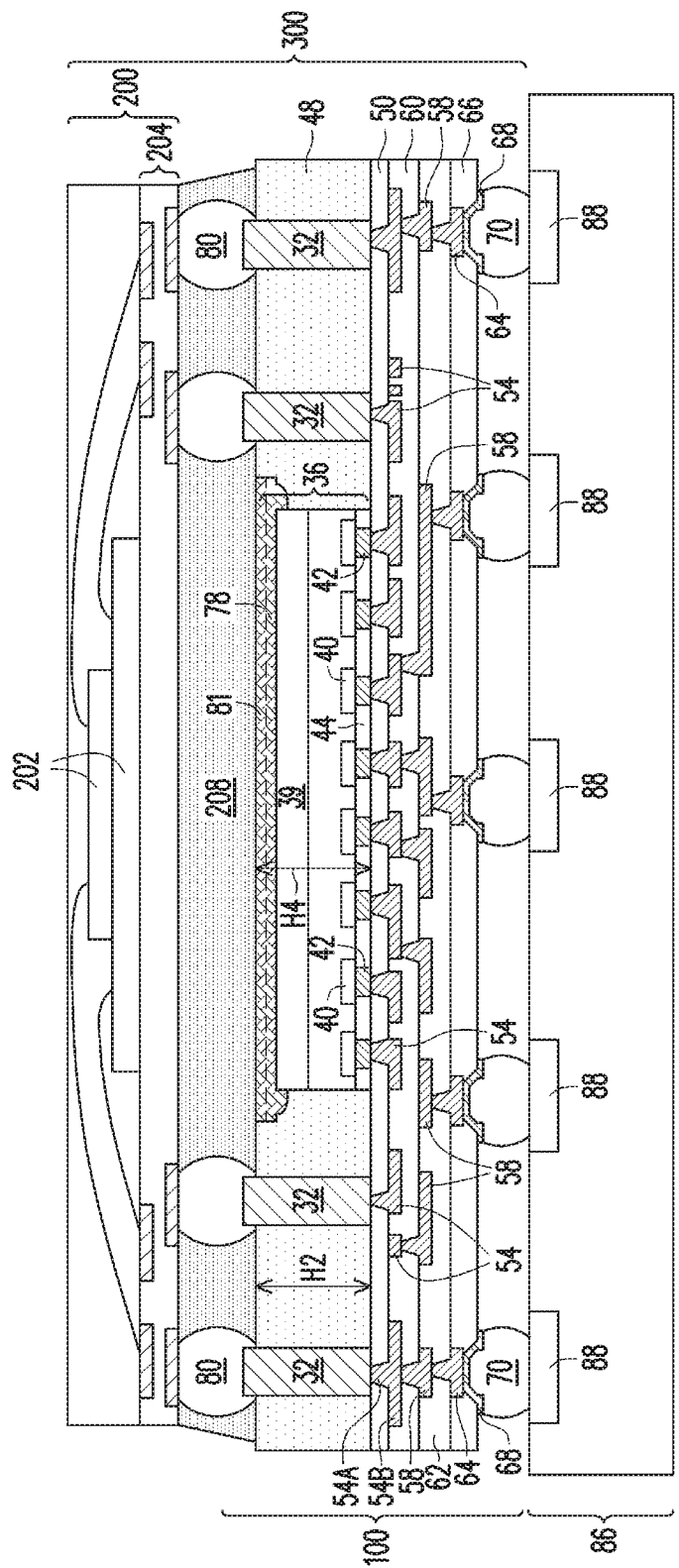

FIG. 20F illustrates the cross-sectional view of package 300 in accordance with some embodiments of the present disclosure. Package 300 in accordance with these embodiments are similar to the package 300 shown in FIG. 20A, except conductive paste 78 has a top surface coplanar with or lower than the top surface of encapsulating material 48. For example, the top surface of conductive paste 78 shown using a solid line is coplanar with the top surface of encapsulating material 48. Dashed line 81 illustrates the top surface of conductive paste 78 in accordance with some embodiments, and the top surface of conductive paste 78 is lower than the top surface of encapsulating material 48. The embodiments are the results of the faster etching of substrate 39 of device die 36 in the step shown in FIG. 16A. In FIG. 20F, the total thickness H4 of device die 36 and conductive paste 78 is equal to or smaller than the height H3 of encapsulating material 48.

The packages in accordance with some embodiments of the present disclosure are formed using RDL-last processes, in which DAF 38 and possibly polymer buffer layer 23 are formed and then etched. On the other hand, RDL-first process is not preferred as a mean for avoiding the formation of DAF and polymer buffer layer. The reason is that in the RDL-first process, both the silicon substrate 39 of the device die and through-vias are planarized simultaneously, and it was found that the copper polished from the through-vias contaminates the silicon substrate, causing the leakage of the device die.

In above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By removing the polymer buffer layer and the die-attach film in packages, the polymer buffer layer and the die-attach film no longer hamper the heat dissipation, and hence the heat dissipation of the resulting package is improved.

In accordance with some embodiments of the present disclosure, a method includes forming a release film over a carrier, attaching a device over the release film through a die-attach film, encapsulating the device in an encapsulating material, performing a planarization on the encapsulating material to expose the device, detaching the device and the encapsulating material from the carrier, and etching the die-attach film to expose a back surface of the device. In an embodiment, the method further includes applying a thermal conductive paste on the back surface of the device; and dispensing an underfill to contact the thermal conductive paste. In an embodiment, after the die-attach film is etched, a recess is formed to extend into the encapsulating material, and the thermal conductive paste is filled into the recess. In an embodiment, the method further includes dispensing an underfill, wherein the underfill in in contact with the back surface of the device. In an embodiment, after the die-attach film is etched, a recess is formed to extend into the encapsulating material, and the underfill is filled into the recess. In an embodiment, the method further includes forming a metal post over the carrier, wherein the metal post is encapsulated in the encapsulating material, wherein in the etching the die-attach film, a portion of the encapsulating material is etched, and the through-via protrudes out of the encapsulating material. In an embodiment, after the etching the die-attach film, the die-attach film is fully removed. In an embodiment, after the etching the die-attach film, a first portion of the die-attach film in contact with the back surface of the device is removed, and a second portion of the die-attach film in contact with a sidewall of the device remains.

In accordance with some embodiments of the present disclosure, a method includes coating a release layer on a carrier; forming a metal post over the release layer; attaching a device die over the release layer through a die-attach film; encapsulating the device die and the metal post in an encapsulating material; projecting a light on the release layer to decompose a portion of the release layer; lifting off the carrier from the encapsulating material, the device die, and the metal post; etching the die-attach film to reveal a back surface of the device die; bonding a package to the metal post; and dispensing an underfill, wherein a portion of the underfill is disposed between the device die and the package. In an embodiment, the method further includes applying a thermal conductive paste on the back surface of the device die; and curing the thermal conductive paste, wherein the underfill contacts the thermal conductive paste. In an embodiment, the underfill contacts the back surface of the device die. In an embodiment, when the die-attach film is etched, the encapsulating material is also etched to result in the metal post to protrude out of the encapsulating material. In an embodiment, the etching the die-attach film results in a recess to be formed extending into the encapsulating material. In an embodiment, the underfill is filled into the recess.

In accordance with some embodiments of the present disclosure, package includes an encapsulating material; a through-via penetrating through the encapsulating material, wherein the through-via includes a portion protruding higher than a top surface of the encapsulating material; a device encapsulated in the encapsulating material, wherein the device includes a semiconductor substrate with a back surface; a package component over and bonded to the through-via; and an underfill between the encapsulating material and the package component, wherein the underfill is in contact with the encapsulating material. In an embodiment, the underfill is further in contact with the back surface of the semiconductor substrate in the device. In an embodiment, the underfill further includes a portion extending into the encapsulating material, wherein the portion of the underfill contacts a sidewall of the semiconductor substrate in the device. In an embodiment, the package further includes a thermal conductive paste over and contacting the back surface of the semiconductor substrate in the device, with a portion of the underfill overlapping the thermal conductive paste. In an embodiment, the thermal conductive paste further includes a portion extending into the encapsulating material, wherein the portion of the thermal conductive paste contacts a sidewall of the semiconductor substrate in the device. In an embodiment, the package further includes a solder region bonding the through-via to the package component, wherein the solder region contacts sidewalls of the through-via.

In accordance with some embodiments of the present disclosure, method includes removing a layer from a region overlying a die-attach film, an encapsulating material, and a through-via penetrating through the encapsulating material, wherein a die-attach film is revealed, and the die-attach film joins a device with the layer; etching the die-attach film to at least partially remove the die-attach film, wherein a surface of the device is exposed after the die-attach film is etched; applying a paste onto the surface of the device; curing the paste; bonding a package component to the through-via, wherein the paste is spaced apart from the package component by a gap; and filling an underfill into the gap. In an embodiment, the removing the layer includes removing a polymer buffer layer. In an embodiment, the removing the layer includes etching LTHC coating material. In an embodiment, after the etching the die-attach film, a recess is formed extending into the encapsulating material, and the paste is filled into the recess. In an embodiment, after the etching the die-attach film, a remaining portion of the die-attach film is left extending into the encapsulating material, and the paste has a portion over and contacting the remaining portion of the die-attach film. In an embodiment, in the etching the die-attach film, the encapsulating material is etched to allow a portion of the through-via to protrude out of the encapsulating material.

In accordance with some embodiments of the present disclosure, package includes an encapsulating material; a device die encapsulated in the encapsulating material, wherein the device die includes a semiconductor substrate with a back surface; a thermal conductive paste over and contacting the device die; a package component over the encapsulating material and the device die; and a underfill separating, and in contact with, the thermal conductive paste and the package component. In an embodiment, the underfill is in contact with the encapsulating material.

In accordance with some embodiments of the present disclosure, package includes an encapsulating material; a device die encapsulated in the encapsulating material, wherein the device die includes a semiconductor substrate; and a filling material comprising: a first portion extending into the encapsulating material to contact a sidewall of the device die; and a second portion over and contacting a top surface of the semiconductor substrate in the device die. In an embodiment, the filling material includes a thermal conductive paste, and the package further includes an underfill, with a portion of the underfill being over and contacting the thermal conductive paste.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a release film over a carrier;
   attaching a device over the release film through a die-attach film;
   encapsulating the device in an encapsulating material;
   performing a planarization on the encapsulating material to expose the device;
   forming redistribution lines to electrically couple to the device;
   detaching the device and the encapsulating material from the carrier while the die-attach film remains attached to the device;
   after the detaching of the device and the encapsulating material from the carrier, removing the die-attach film to expose a back surface of the device; and
   applying a thermal conductive material on the back surface of the device.

2. The method of claim 1 further comprising:
   dispensing an underfill to contact the thermal conductive material.

3. The method of claim 1, wherein after the die-attach film is removed, a recess is formed to extend into the encapsulating material, and the thermal conductive material is filled into the recess.

4. The method of claim 3, wherein the thermal conductive material laterally extends beyond the recess.

5. The method of claim 1, wherein the thermal conductive material has a thermal conductivity higher than about 1 W/k*m.

6. The method of claim 1, wherein the thermal conductive material is selected from the group consisting of solder, silver, copper paste, and combinations thereof.

7. The method of claim 1 further comprising:
   forming a metal post over the carrier, wherein the metal post is encapsulated in the encapsulating material, wherein in the removing the die-attach film, a portion of the encapsulating material is removed, and the metal post protrudes out of the encapsulating material.

8. The method of claim 1, wherein after the removing the die-attach film, the die-attach film is fully removed.

9. A method comprising:
   coating a release layer on a carrier;
   forming a metal post over the release layer;
   attaching a device die over the release layer through a die-attach film;
   encapsulating the device die and the metal post in an encapsulating material;
   projecting a light on the release layer to decompose a portion of the release layer;
   lifting off the carrier from the encapsulating material, the device die, and the metal post;
   etching the die-attach film to reveal a back surface of the device die;
   applying a thermal conductive material on the back surface of the device die;
   bonding a package to the metal post; and
   dispensing an underfill, wherein a portion of the underfill is disposed between the device die and the package.

10. The method of claim 9 further comprising:
    curing the thermal conductive material, wherein the underfill contacts the thermal conductive material.

11. The method of claim 9, wherein the underfill contacts the back surface of the device die.

12. The method of claim 9, wherein when the die-attach film is etched, the encapsulating material is also etched to result in the metal post to protrude out of the encapsulating material.

13. The method of claim 9, wherein the etching the die-attach film results in a recess to be formed extending into the encapsulating material.

14. The method of claim 13, wherein the underfill is filled into the recess.

15. A package comprising:
an encapsulating material;
a through-via penetrating through the encapsulating material;
a device encapsulated in the encapsulating material, wherein the device comprises a semiconductor substrate with a back surface;
a package component over and bonded to the through-via;
a thermal conductive material over and contacting the back surface of the semiconductor substrate in the device; and
an underfill between the encapsulating material and the package component, wherein the underfill is in contact with the encapsulating material.

16. The package of claim 15, wherein the underfill is further in contact with the back surface of the semiconductor substrate in the device.

17. The package of claim 16, wherein the underfill further comprises a portion extending into the encapsulating material, wherein the portion of the underfill contacts a sidewall of the semiconductor substrate in the device.

18. The package of claim 15, wherein the through-via comprises a portion protruding higher than a top surface of the encapsulating material.

19. The package of claim 15, wherein the thermal conductive material further comprises a portion extending into the encapsulating material, wherein the portion of the thermal conductive material contacts a sidewall of the semiconductor substrate in the device.

20. The package of claim 15 further comprising a solder region bonding the through-via to the package component, wherein the solder region contacts sidewalls of the through-via.

* * * * *